(12) United States Patent
Konno et al.

(10) Patent No.: US 9,588,150 B2
(45) Date of Patent: Mar. 7, 2017

(54) ELECTRIC CURRENT MEASURING APPARATUS

(71) Applicant: ADAMANT CO., LTD., Tokyo (JP)

(72) Inventors: Yoshihiro Konno, Tochigi (JP); Masaru Sasaki, Kawaguchi (JP)

(73) Assignee: ADAMANT CO., LTD., Tokyo (JP)

( * ) Notice: Subject to any disclaimer, the term of this patent is extended or adjusted under 35 U.S.C. 154(b) by 0 days.

(21) Appl. No.: 14/770,944

(22) PCT Filed: Feb. 27, 2014

(86) PCT No.: PCT/JP2014/001080
§ 371 (c)(1),
(2) Date: Aug. 27, 2015

(87) PCT Pub. No.: WO2014/136411
PCT Pub. Date: Sep. 12, 2014

(65) Prior Publication Data
US 2016/0011237 A1    Jan. 14, 2016

(30) Foreign Application Priority Data

Mar. 7, 2013  (JP) ................................ 2013-062868

(51) Int. Cl.
*G01R 15/24* (2006.01)
*G01R 19/00* (2006.01)
(52) U.S. Cl.
CPC ....... *G01R 15/246* (2013.01); *G01R 19/0092* (2013.01)
(58) Field of Classification Search
CPC .... G01R 15/245; G01R 15/246; G01R 19/32; G01R 19/0092
See application file for complete search history.

(56) References Cited

U.S. PATENT DOCUMENTS 6,023,331 A   2/2000  Blake et al.
6,188,811 B1  2/2001  Blake
(Continued)

FOREIGN PATENT DOCUMENTS

CA   2 380 696 A1   1/2001
JP   2002-529709 A  9/2002
(Continued)

OTHER PUBLICATIONS

May 13, 2014 International Search Report issued in International Patent Application No. PCT/JP2014/001080.
(Continued)

*Primary Examiner* — Huy Q Phan
*Assistant Examiner* — Adam Clarke
(74) *Attorney, Agent, or Firm* — Oliff PLC

(57) ABSTRACT

Current measuring device keeps fluctuation range for the ratio error in output within ±0.5% range and simplified assembly thereof. The measuring device includes at least a light entrance and exit, optical fiber for a sensor, Faraday rotator, first and second ¼-wavelength plates, polarization separator, light source, and signal-processing-circuit including a photoelectric-conversion-element. Optical fiber for a sensor has birefringence and includes one end wherein two circularly polarized light-beams having different rotation enter directions and another end reflects circularly polarized light-beams entered. Phase difference of two linearly polarized light-beams in the round-trip light path between two ¼-wavelength plates is compensated, and the Faraday rotational angle when the Faraday rotator is magnetically saturated set to 22.5°+α° so fluctuation range for ratio error in measured value of the current to be measured is set in range, ±0.5%. The crystal-axes on optical faces of two ¼-wavelength plates are set to be perpendicular or same direction.

12 Claims, 16 Drawing Sheets

(56) References Cited

U.S. PATENT DOCUMENTS

| | | | |
|---|---|---|---|
| 6,351,331 B1* | 2/2002 | Fukuda | G02F 1/0036 |
| | | | 117/942 |
| 6,563,589 B1 | 5/2003 | Bennett et al. | |
| 8,957,667 B2 | 2/2015 | Konno et al. | |
| 2007/0273358 A1 | 11/2007 | Kurosawa et al. | |
| 2009/0214152 A1* | 8/2009 | Huang | G01R 15/246 |
| | | | 385/11 |
| 2010/0253320 A1* | 10/2010 | Kurosawa | G01R 15/246 |
| | | | 324/96 |
| 2011/0204875 A1 | 8/2011 | Blake et al. | |
| 2012/0091991 A1 | 4/2012 | Konno et al. | |
| 2013/0088223 A1 | 4/2013 | Konno et al. | |

FOREIGN PATENT DOCUMENTS

| | | |
|---|---|---|
| JP | 2003-505670 A | 2/2003 |
| JP | 2007-040884 A | 2/2007 |
| JP | 2010-271292 A | 12/2010 |
| WO | 2006/022178 A1 | 3/2006 |
| WO | 2011/161969 A1 | 12/2011 |

OTHER PUBLICATIONS

Sep. 22, 2016 Supplementary Search Report issued in European Patent Application No. 14 76 0774.

* cited by examiner

ELECTRIC CURRENT MEASURING APPARATUS

TECHNICAL FIELD

The present invention relates to an electric current measuring apparatus using the Faraday effect, and in particular, to a reflective electric current measuring apparatus in which light is incident to one end of an optical fiber for a sensor and reflected from the other end thereof.

BACKGROUND OF THE INVENTION

An electric current measuring apparatus is known in which the Faraday effect of an optical fiber is used and which has various advantages, such as small size, flexibility, electromagnetic noise resistance, long-distance signal transmission, and withstand voltage, and the like. As an example of the electric current measuring apparatus, Patent document 1, WO 2006/022178 discloses a reflective electric current measuring apparatus which uses the Faraday effect, that is, uses rotation of a polarization plane of a light by action of a magnetic field.

This electric current measuring apparatus is a reflective electric current measuring apparatus which uses a lead-glass fiber as a optical fiber for a sensor, and in which a mirror is disposed at the other end of the optical fiber for a sensor. The optical fiber for a sensor is provided around the periphery of an electric conductor, through which measured electric current flows, to detect the measured electric current. Basically, while a linearly polarized light incident from one end of the optical fiber for a sensor travels to the mirror and returns, a Faraday rotation angle of the linearly polarized light rotated by a magnetic field of the measured electric current is detected. The electric current measuring apparatus also includes a Faraday rotator made of a ferromagnetic crystal such as YIG.

However, the Faraday rotation angle of the Faraday rotator used in the electric current measuring apparatus has a characteristic (temperature characteristic) depending on ambient temperature. The optical fiber for a sensor also has a temperature characteristic of a ratio error resulting from the temperature dependency of a Verdet constant and the Faraday rotation angle. Thus, it is necessary to perform not only compensation in the Faraday rotator but also compensation for (reduction in) the temperature characteristic of the optical fiber for a sensor. As an electric current measuring apparatus which fully compensates for the temperature characteristics of both the Faraday rotator and the optical fiber for a sensor, the present inventors invented an electric current measuring apparatus which set a fluctuation range of a ratio error within ±0.5% or ±0.2% (refer to Patent Literature 2).

The electric current measuring apparatus described in Patent document 2, JP 2010-271292A is configured to include at least a optical fiber for a sensor, a polarization splitter, a Faraday rotator, a light source, and a signal processing circuit including a photoelectric conversion element. The optical fiber for a sensor is provided around the periphery of an electric conductor through which measured electric current flows. Also, a Faraday rotation angle of the Faraday rotator at the time of magnetic saturation is set to $22.5°+\alpha°$ at a temperature of 23° C. to change the Faraday rotation angle as much as $\alpha°$ from 22.5°, such that a fluctuation range of a ratio error in a measurement value of the measured electric current output from the signal processing circuit is set within a range of ±0.5% or ±0.2% in a temperature range between −20° C. or higher and 80° C. or lower.

By reducing the fluctuation range of the ratio error of the Faraday rotator, the fluctuation range of the ratio error in the measurement value of the measured electric current output from the signal processing circuit is suppressed to be within ±0.5% or ±0.2%. Therefore, the compensation for the temperature characteristic of the ratio error in the measurement value can be performed in the Faraday rotator, thereby improving reliability of the electric current measuring apparatus. Also, by suppressing the fluctuation range of the ratio error to be within ±0.5% or ±0.2%, it is possible to achieve the electric current measuring apparatus which can be applied to a protection relay.

CITATION LIST

Patent Literature

Patent document 1: WO 2006/022178 A (pages 4 to 7, FIG. 18)
Patent document 2: JP 2010-271292 A

SUMMARY OF INVENTION

Technical Problem

However, as a result the present inventors actually suppressed the fluctuation range of the ratio error in the electric current measuring apparatus to be within ±0.5%, the present inventors found through consideration of the electric current measuring apparatus in Patent document 2 that birefringence inherent in the optical fiber for a sensor was relatively revealed as a large target for compensation.

The optical fiber for a sensor has birefringence even in a linear state. The above optical fiber for a sensor is provided around the periphery of the electric conductor. Accordingly, the optical fiber for a sensor is deformed from the linear state. This deformation along with bending generates stress in the optical fiber for a sensor, and the stress generates larger birefringence in the optical fiber for a sensor. Consequently, the present inventors have found that, as the ratio error is reduced more, two propagation modes each having an uncontrollable phase are output at the time of output from the optical fiber for a sensor, and fluctuation and attenuation significantly occur in the output from the electric current measuring apparatus.

When the present inventors actually measured the fluctuation range of the ratio error in the electric current measuring apparatus disclosed in Patent document 2, as illustrated in FIG. 31, the fluctuation range of the ratio error resulting from the birefringence of the optical fiber for a sensor was revealed in a range of approximately −1.0% to approximately 1.2% (in a range of approximately −0.7% to approximately 1.2% in a temperature range between −20° C. or higher and 80° C. or lower) in a measurement value of measured electric current output from the electric current measuring apparatus. Accordingly, the present inventors have found that it is difficult to suppress the fluctuation range of the ratio error in the measurement value of the measured electric current to be within ±0.5% only by reducing the fluctuation range of the ratio error of the Faraday rotator as described above.

The present invention is accomplished by taking such circumstances as mentioned above into consideration, and an object of the present invention is to provide an electric current measuring apparatus enabling a fluctuation range of a ratio error in an output to be set within ±0.5% reliably and enabling assembling to be facilitated.

Solution to Problem

The above problem is solved by the present invention described below.

(1) An electric current measuring apparatus at least includes a light incident and emitting unit, an optical fiber for a sensor, a Faraday rotator, a first quarter-wave, i.e. ¼ wavelength plate and a second quarter-wave, i.e. ¼ wavelength plate, a polarization splitter, a light source, and a signal processing circuit including a photoelectric conversion element.

The light incident and emitting unit is constituted by two waveguides arrayed.

The light incident and emitting unit, the polarization splitter, the first quarter-wave plate, the second quarter-wave plate, the Faraday rotator, and the optical fiber for a sensor are arranged in this order.

The optical fiber for a sensor is birefringent, is provided around a periphery of an electric conductor through which measured electric current flows, and includes a first end into which two circularly polarized lights having different rotation angles are incident and a second end reflecting the incident circularly polarized lights.

The second quarter-wave plate is provided on the first end side of the optical fiber for a sensor.

The Faraday rotator is arranged between the first end side of the optical fiber for a sensor and the second quarter-wave plate.

A light emitted from the light source is reflected on the second end to set a reciprocating optical path of the polarization splitter, the first quarter-wave plate, the second quarter-wave plate, the Faraday rotator, and the optical fiber for a sensor in which the light reciprocates.

In the reciprocating optical path between the first quarter-wave plate and the second quarter-wave plate, two linearly polarized lights are propagated, and a phase difference between the two linearly polarized lights in the reciprocating optical path between the first quarter-wave plate and the second quarter-wave plate is compensated.

A Faraday rotation angle of the Faraday rotator at time of magnetic saturation is set to $22.5°+\alpha°$ (factor) at a temperature of 23° C., and a fluctuation range of a ratio error in a measurement value of the measured electric current output from the signal processing circuit is set within a range of ±0.5%.

Directions of crystal axes on respective optical surfaces of the first quarter-wave plate and the second quarter-wave plate are set to be perpendicular to each other or in an equal direction.

The reciprocating optical path between the first quarter-wave plate and the second quarter-wave plate through which the two linearly polarized lights are propagated may be constituted by a polarization maintaining fiber (PMF) or two birefringent elements in which directions of crystal axes on optical surfaces correspond, and in which directions in which an extraordinary light is shifted are set to be reversed.

(2) In the electric current measuring apparatus according to an embodiment of the present invention, a direction of a crystal axis on an optical surface of the polarization splitter and the direction of the crystal axis on the optical surface of the first quarter-wave plate are set to be perpendicular to each other or in an equal direction.

(3) In the electric current measuring apparatus according to another embodiment of the present invention, the direction of the crystal axis on the optical surface of the polarization splitter, the direction of the crystal axis on the optical surface of the first quarter-wave plate, and the direction of the crystal axis on the optical surface of the second quarter-wave plate are set to be in an equal direction.

(4) In the electric current measuring apparatus according to another embodiment of the present invention, a temperature range in which the fluctuation range is set within the range of ±0.5% is preferably 100 degrees in the Celsius scale.

(5) In the electric current measuring apparatus according to another embodiment of the present invention, the temperature range of 100 degrees in the Celsius scale. is preferably between −20° C. or higher and 80° C. or lower.

(6) In of the electric current measuring apparatus according to another embodiment of the present invention, the Faraday rotator preferably has a temperature characteristic of a Faraday rotation angle in which the Faraday rotation angle at time of magnetic saturation changes in a quadratically-curved manner along with a temperature change.

(7) In of the electric current measuring apparatus according to another embodiment of the present invention, the Faraday rotator is preferably constituted by two or more Faraday elements.

(8) In the electric current measuring apparatus according to another embodiment of the present invention, Faraday rotation angles of the two or more Faraday elements preferably differ from each other.

(9) In the electric current measuring apparatus according to another embodiment of the present invention, the fluctuation range of the ratio error in the measurement value of the measured electric current output from the signal processing circuit is preferably set within a range of ±0.2%.

(10) In the electric current measuring apparatus according to another embodiment of the present invention, a temperature range in which the fluctuation range is set within the range of ±0.2% is preferably 100 degrees in the Celsius scale.

(11) In the electric current measuring apparatus according to another embodiment of the present invention, the temperature range of 100 degrees in the Celsius scale is preferably between −20° C. or higher and 80° C. or lower.

(12) In the electric current measuring apparatus according to another embodiment of the present invention, the optical fiber for a sensor is preferably a lead-glass fiber.

Advantageous Effects of Invention

According to the present invention described in claim (that is, the invention described in the above (1)), in addition to the change of the rotation angle of the Faraday rotator as much as $\alpha°$ from 22.5° at the temperature of 23° C. to reduce the fluctuation range of the ratio error in the electric current measuring apparatus, the ratio error along with the birefringence inherent in the optical fiber for a sensor is compensated, and the phase difference between the two linearly polarized lights in the reciprocating optical path between the first quarter-wave plate and the second quarter-wave plate is compensated. Accordingly, all of the phase differences other than the phase difference of the rotation angle of the Faraday rotator are compensated except a phase difference φ caused by the Faraday effect in the optical fiber for a sensor and do not appear in the output of the electric current measuring apparatus. Consequently, since the fluctuation range of the ratio error resulting from the birefringence of the optical fiber for a sensor (approximately −0.1% to approximately 1.2%) is compensated, and the phase difference between the two linearly polarized lights in the reciprocating optical path between the first quarter-wave plate and the second quarter-wave plate is compensated, the fluctuation range of the ratio error in the output of the electric current measuring apparatus can be set within ±0.5% reliably.

Also, since the phase differences other than the phase difference of the rotation angle of the Faraday rotator are compensated except the phase difference φ, the output of the electric current measuring apparatus is not influenced by phase changes at the time of light propagation in the optical fiber of the electric current measuring apparatus due to application of disturbances. Accordingly, an output characteristic of the electric current measuring apparatus can be stabilized.

Further, the directions of the crystal axes on the respective optical surfaces of the first and second quarter-wave plates are set to be perpendicular or in equal directions. Accordingly, even in a case in which the number of components increases as much as the two quarter-wave plates when the electric current measuring apparatus using circularly polarized lights is constituted, no fine adjusting operation of the angles of the mutual crystal axes is required. Thus, high function of suppressing the fluctuation range of the ratio error to be within ±0.5% and facilitation of assembling of components can be achieved at the same time.

Still further, since the electric current measuring apparatus according to the present invention can be achieved broadly regardless of the kind of the optical fiber for a sensor, the yield ratio of the electric current measuring apparatus can also be improved.

Also, according to the present invention described in claim 2 (that is, the invention described in the above (2)), in addition to the effect of the invention described in claim 1, no fine adjusting operation of the angles of the mutual crystal axes is required when the polarization splitter is installed to the first quarter-wave plate. Thus, an assembling operation of the polarization splitter and the first quarter-wave plate can be facilitated.

Further, according to the present invention described in claim 3 (that is, the invention described in the above (3)), in addition to the effect of the invention described in claim 1, no adjusting operation of the angles of the crystal axes of the polarization splitter and the two quarter-wave plates and no installing operation of the polarization splitter and the two quarter-wave plates are required. Thus, an assembling operation of the polarization splitter and the two quarter-wave plates can further be facilitated.

Still further, according to the present invention described in claims 4 and 5 or 10 and 11 (that is, the invention described in the above (4) and (5) or (10) and (11)), by achieving the fluctuation range of the ratio error of ±0.5% or ±0.2% through the temperature range of 100 degrees in the Celsius scale (between −20° C. or higher and 80° C. or lower), it is possible to provide the electric current measuring apparatus having practicality to cover the normal temperature range, which ranges from −10° C. or higher and 40° C. or lower.

Still further, according to the present invention described in claim 6 or 9 (that is, the invention described in the above (6) or (9)), by providing the Faraday rotator having the temperature characteristic of the Faraday rotation angle in which the Faraday rotation angle at time of magnetic saturation changes in a quadratically-curved manner along with a temperature increase, it is possible to suppress the fluctuation range of the ratio error in the measurement value of the measured electric current output from the signal processing circuit to be within ±0.5% or ±0.2%. Accordingly, the electric current measuring apparatus can be used for application in which the temperature characteristic of the ratio error within ±0.2% is required (e.g., an electric energy meter for measuring an electric rate which requires strict measurement) in addition to application within ±0.5%.

Still further, according to the present invention described in claim 7 (that is, the invention described in the above (7)), the Faraday rotator having a desired rotation angle can be obtained in a stable manner.

Still further, according to the present invention described in claim 8 (that is, the invention described in the above (8)), since the Faraday rotation angles of the respective Faraday elements can differ from each other, the temperature characteristic of each Faraday element can be set to be a desired characteristic.

Still further, according to the present invention described in claim 12 (that is, the invention described in the above (12)), even when the lead-glass fiber is used for the optical fiber for a sensor, it is possible to suppress the fluctuation range of the ratio error in the measurement value of the measured electric current output from the signal processing circuit to be within ±0.5% (or ±0.2%).

DETAILED DESCRIPTION OF THE PREFERRED EMBODIMENTS

Figure 1:
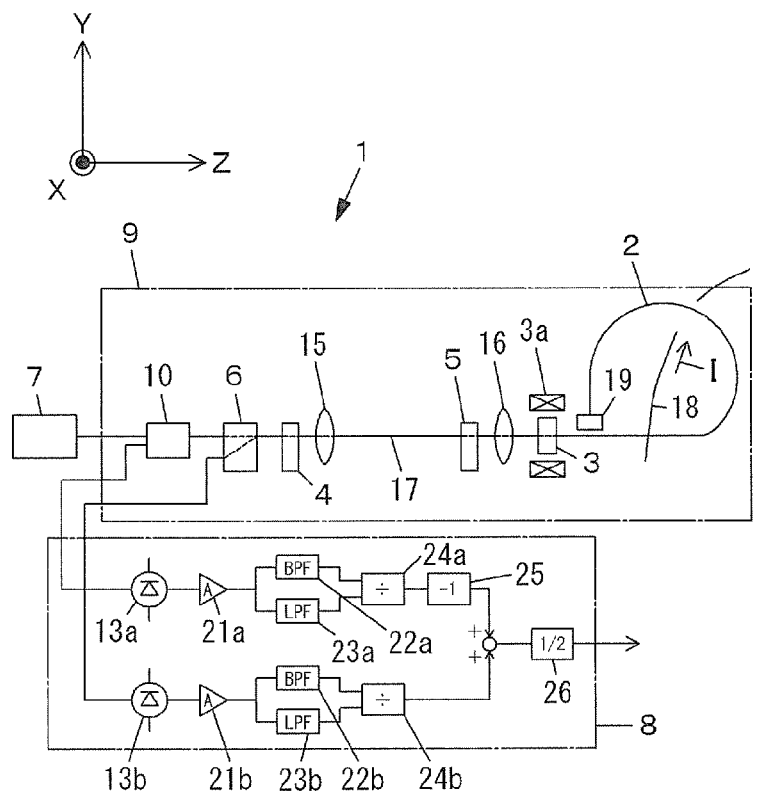
FIG. 1 is an explanatory diagram illustrating a configuration of an electric current measuring apparatus according to an embodiment of the present invention.

Hereinbelow, an electric current measuring apparatus according to an embodiment of the present invention will be described in detail with reference to the drawings. An electric current measuring apparatus 1 illustrated in FIG. 1 is configured to include at least a light incident and emitting unit, a optical fiber for a sensor 2, a Faraday rotator 3, a first quarter-wave plate 4 and a second quarter-wave plate 5, a polarization splitter 6, a light source 7, and a signal processing circuit 8 including photoelectric conversion elements 13a and 13b. Also, a light emitted from the light source 7 is reflected on the other end of the optical fiber for a sensor 2 to set a reciprocating optical path of the polarization splitter 6, the first quarter-wave plate 4, the second quarter-wave plate 5, the Faraday rotator 3, and the optical fiber for a sensor 2 in which the light reciprocates.

Meanwhile, in the following description, an XYZ orthogonal coordinate system illustrated in FIG. 1 is set, and positional relation among the respective components is described with reference to this XYZ orthogonal coordinate system. A light propagating direction from the polarization splitter 6 to the optical fiber for a sensor 2 is set to be a Z axis, and a horizontal direction and a vertical direction in a plane perpendicular to the Z axis are set to be an X axis and a Y axis, respectively. XYZ orthogonal coordinate systems illustrated in FIGS. 1 to 23 correspond to each other in the respective figures.

Figure 2:
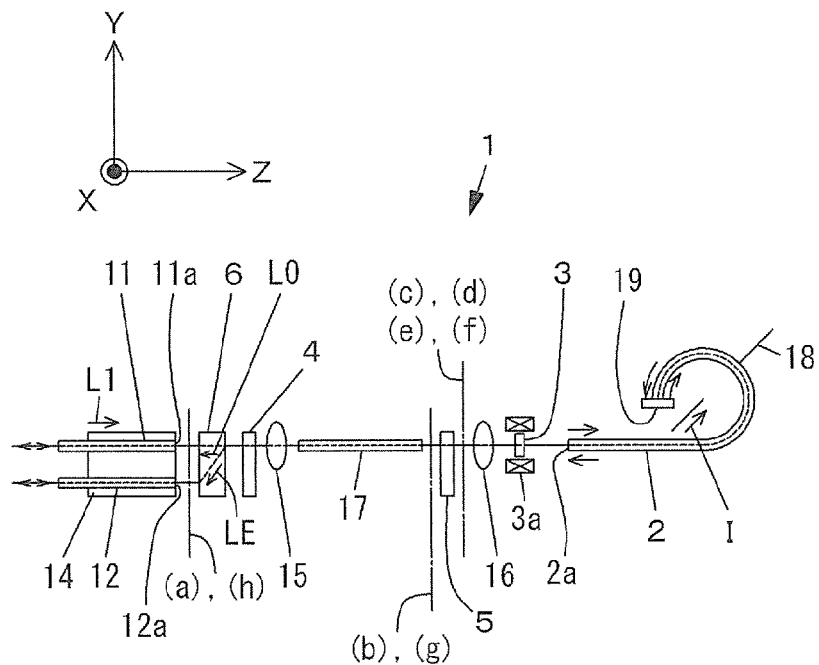
FIG. 2 is an explanatory diagram illustrating a configuration of an optical system (except a circulator) in the electric current measuring apparatus in FIG. 1.

The electric current measuring apparatus 1 roughly includes the light source 7, the signal processing circuit 8, and an optical system 9 as illustrated in FIG. 1, and the optical system 9 includes respective components illustrated in FIG. 2 and a circulator 10. The light incident and emitting unit is constituted by a first optical fiber 11 and a second optical fiber 12 arrayed as two waveguides. Also, as the respective components illustrated in FIGS. 2 to 4, the light incident and emitting unit, the polarization splitter 6, the first quarter-wave plate 4, the second quarter-wave plate 5, the Faraday rotator 3, and the optical fiber for a sensor 2 are arranged in this order.

Figure 3:
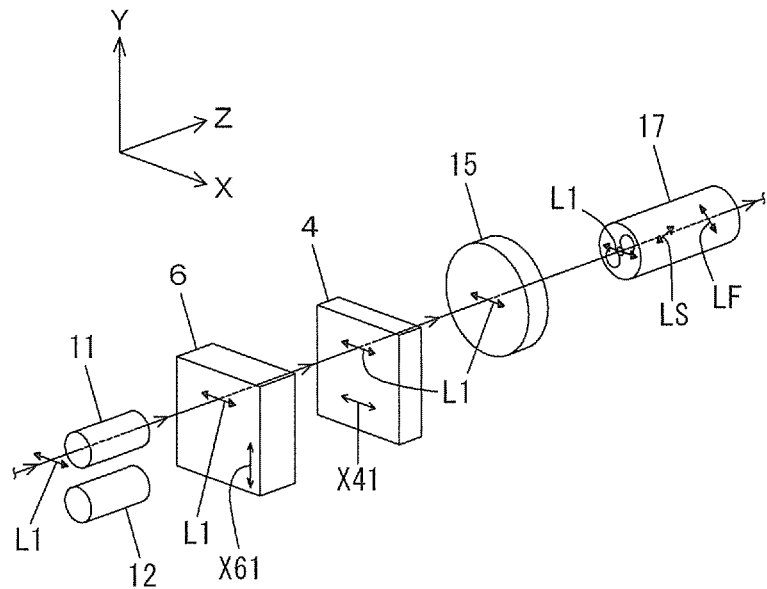
FIG. 3 is a perspective view illustrating arrangement of respective components from a light incident and emitting unit to a polarization maintaining fiber and a polarization state of light on an outbound path in the electric current measuring apparatus in FIG. 2.
Figure 4:
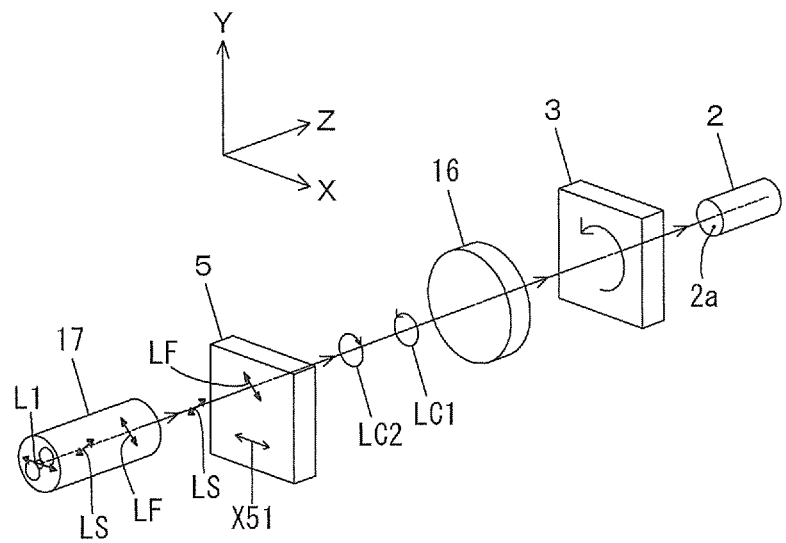
FIG. 4 is a perspective view illustrating arrangement of the respective components from the polarization maintaining fiber to a optical fiber for a sensor and a polarization state of light on the outbound path in the electric current measuring apparatus in FIG. 2.
Figure 5:
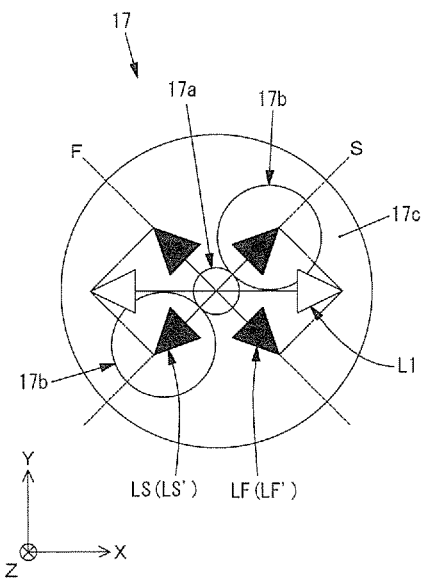
FIG. 5 is a view of an end surface of the polarization maintaining fiber illustrating directions of polarization maintaining axes of the polarization maintaining fiber in FIG. 2 and polarization states of incident lights into the polarization maintaining fiber.
Figure 6:
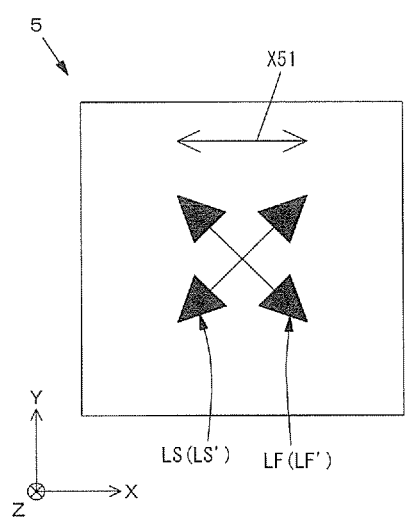
FIG. 6 illustrates a direction of a crystal axis of a second quarter-wave plate in FIG. 2 and polarization states of propagation lights to the second quarter-wave plate.
Figure 7:
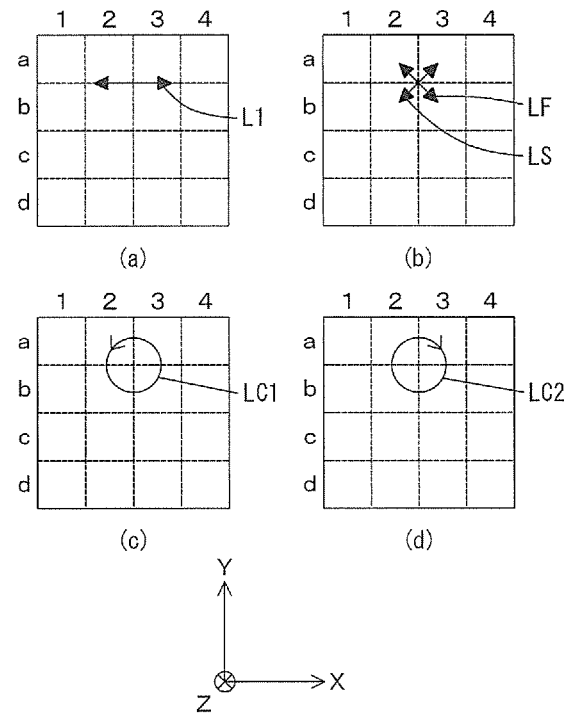
FIG. 7 illustrates polarization states of propagation lights from emission from a first optical fiber until reflection on the other end of the optical fiber for a sensor in the electric current measuring apparatus in FIG. 2.

A linearly polarized light L1 having a polarizing direction parallel to a direction of the X axis is incident into the polarization splitter 6. The linearly polarized light L1 is incident from the first optical fiber 11 into the polarization splitter 6 as illustrated in FIGS. 2 and 3.

The first optical fiber 11 is a polarization maintaining fiber and an optical fiber that can transmit a light while maintaining a linear polarization state (so called PMF; Polarization Maintaining Fiber), and an end surface 11a on one end side thereof is arranged close to the polarization splitter 6. Alternatively, the end surface 11a and the polarization splitter 6 may be arranged to abut on each other. As a result, the first optical fiber 11 has a function of letting the linearly polarized light L1 incident into the polarization splitter 6 and propagating an ordinary light LO emitted from the polarization splitter 6 to the photoelectric conversion element 13a. This polarization maintaining fiber is arranged so that a principal axis thereof may correspond to the polarizing direction (the direction of the X axis) of the linearly polarized light L1.

The second optical fiber 12 is a single-mode optical fiber, a multimode optical fiber, or a polarization maintaining fiber, and an end surface 12a on one end side thereof is arranged close to the polarization splitter 6. Alternatively, the end surface 12a and the polarization splitter 6 may be arranged to abut on each other. As a result, the second optical fiber 12 has a function of propagating an extraordinary light LE emitted from the polarization splitter 6 to the photoelectric conversion element 13b.

In a case of the present embodiment, the first and second optical fibers 11 and 12 have the end surfaces 11a and 12a on one end sides arranged on an equal plane and are held by a dual-core ferrule 14 with a predetermined space interposed therebetween. The aforementioned predetermined space is set in accordance with a thickness of the parallel flat-plate-shaped polarization splitter 6 and physical properties of a material for the polarization splitter 6. The aforementioned predetermined space corresponds to a splitting space of the polarization splitter 6 to enable the ordinary light LO and the extraordinary light LE to be incident into respective cores of the respective optical fibers 11 and 12. It is to be noted that a means for keeping the predetermined space between the first and second optical fibers 11 and 12 does not need to be limited to the ferrule 14 and may be an array substrate provided with two parallel V-shaped recesses. By arranging the optical fibers 11 and 12 in the V-shaped recesses, the optical fibers 11 and 12 can be positioned.

The polarization splitter 6 is a light transmissive optical element and is installed close to the side of the end surface 11a of the first optical fiber 11. The polarization splitter 6 is made of a birefringent element. The polarization splitter 6 has a function as a polarization splitting element, which lets a linearly polarized light transmitted therethrough as it is when the linearly polarized light is incident perpendicularly to a crystal axis and lets a linearly polarized light shifted in parallel and emitted therefrom when the linearly polarized light is incident along the crystal axis. When a linearly polarized light having a polarization plane other than the two planes perpendicular to each other is incident, the linearly polarized light is split into respective vector components according to light intensity, and an ordinary light is transmitted as it is while an extraordinary light is shifted in parallel and emitted. Accordingly, the polarization splitter 6 has a function of splitting a linearly polarized light propagated from a side of the optical fiber for a sensor 2 into the ordinary light LO and the extraordinary light LE perpendicular to each other and letting the linearly polarized light L1 emitted from the light source 7 described below transmitted therethrough.

A material for the polarization splitter 6 can be selected from rutile, $YVO_4$, lithium niobate, and calcite. The birefringent element selected from such materials is processed into a flat plate having opposed light incident and emitting optical surfaces parallel to each other to have a predetermined thickness as the polarization splitter 6. The polarization splitter 6 is installed so that one parallel optical surface may opposed to the end surfaces 11a and 12a of the first optical fiber 11 and the second optical fiber 12 while the other optical surface may be opposed to a lens 15 and the first quarter-wave plate 4. Also, a direction of a crystal axis X61 on each optical surface is set to be parallel to a direction of the Y axis. When a linearly polarized light is incident into one optical surface, the polarization splitter 6 splits the linearly polarized light into the ordinary light LO and the extraordinary light LE, and when the ordinary light LO and the extraordinary light LE are emitted from the other surface, the polarization splitter 6 emits the ordinary light LO and the extraordinary light LE in parallel with a predetermined splitting space interposed therebetween.

The first quarter-wave plate 4 is arranged to be surface-opposed to the polarization splitter 6 so that a direction of a crystal axis X41 on an optical surface thereof may be in the direction of the X axis. As a material therefor a crystal material such as a quartz crystal and magnesium fluoride is used, and the material is processed into a flat plate having opposed light incident and emitting optical surfaces parallel to each other to have a thickness in which a phase of a linearly polarized light having a wavelength $\lambda$ is shifted $\pi/2$.

In a reciprocating optical path between the first quarter-wave plate 4 and the below-mentioned second quarter-wave plate 5, two linearly polarized lights are propagated. In the present embodiment, a polarization maintaining fiber 17 is used as the reciprocating optical path. The polarization maintaining fiber 17 is an optical fiber that can transmit a light while maintaining a linear polarization state (PMF) and is provided in an element wire thereof with a core 17a having a high refractive index, a cladding 17c having a relatively low refractive index concentrically formed around the periphery of this core 17a, and two stress applying portions 17b provided in the cladding 17c as illustrated in an end view in FIG. 5.

The stress applying portions 17b are symmetrically arranged in the cladding 17c with the core 17a interposed therebetween, and each cross-section thereof is circular. Also, a refractive index thereof is further lower than that of the cladding 17c. For the stress applying portions 17b, a material having a larger thermal expansion coefficient than that of the cladding 17c is used, and $B_2O_3$—$SiO_2$ glass is used in particular. Internal stress is applied to the core 17a from both sides by the two stress applying portions 17b (applied in a direction at 45° to the X axis, that is, in a direction of an S axis, in a case of FIG. 5) and causes a stress distribution inside the core 17a to be asymmetric in the direction of the S axis and in a direction perpendicular to the direction (a direction at 45° to the Y axis, that is, in a direction of an F axis), and a birefringent characteristic appears.

Due to this birefringent characteristic, the linearly polarized light L1 incident in the polarizing direction parallel to the X axis is split into respective axial components (the S axis and the F axis in FIG. 5) according to light intensity, and two linearly polarized lights LF and LS are propagated inside the polarization maintaining fiber 17 and are emitted. The stress direction or the S axis and the perpendicular direction or the F axis are referred to as principal axes (polarization maintaining axes) of the polarization maintaining fiber. The asymmetry of the stress distribution differentiates a propagation constant of the S axis from that of the F axis to prevent coupling between polarization modes. Due to the birefringent characteristic, the S axis and the F axis have different group velocities of light. When a mode refractive index is low, the group velocity of light traveling in the direction is high. Thus, the direction of the F axis is referred to as a fast axis. From a similar reason, the direction of the S axis having a high mode refractive index is referred to as a slow axis.

An end surface on one end side of the polarization maintaining fiber 17 is arranged to be opposed to the lens 15 while an end surface on the other end side is arranged to be surface-opposed to the second quarter-wave plate 5. Each of the end surfaces is an erected surface perpendicular to an optical axis of the polarization maintaining fiber 17.

The lens 15 is arranged between the end surface on one end side of the polarization maintaining fiber 17 and the first quarter-wave plate 4. In the present embodiment, the lens 15 is a single lens, and a focus thereof is set approximately at a center of the core on the end surface of the polarization maintaining fiber 17.

Figure 21:
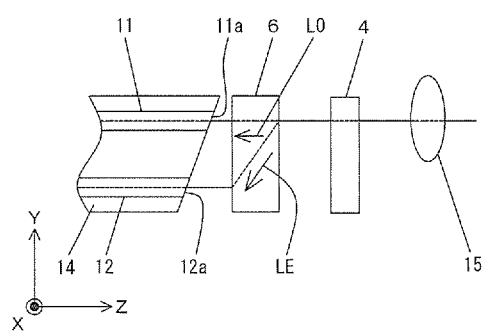
FIG. 21 is a partial schematic view illustrating a modification example of each end surface shape of the first optical fiber and the second optical fiber.

It is to be noted that the respective end surfaces 11*a* and 12*a* of the first and second optical fibers 11 and 12 may be changed to be oblique by being subjected to a polishing process as illustrated in FIG. 21. By forming the end surfaces 11*a* and 12*a* in oblique shapes in this manner, positions of the end surfaces 11*a* and 12*a* can be made to correspond to focal lengths of the ordinary light LO and the extraordinary light LE of the lens 15 to enable a coupling efficiency of the first optical fiber 11 and the second optical fiber 12 to be improved.

The second quarter-wave plate 5 is used as an optical element which converts the two linearly polarized lights LF and LS propagated in the polarization maintaining fiber 17 into circularly polarized lights LC1 and LC2 with respect to the polarization planes. As a material therefor a crystal material such as a quartz crystal and magnesium fluoride is used, and the material is processed into a flat plate having opposed light incident and emitting optical surfaces parallel to each other to have a thickness in which a phase of each of the linearly polarized lights LF and LS each having a wavelength $\lambda$ is shifted $\pi/2$.

The second quarter-wave plate 5 is arranged to be surface-opposed to the polarization maintaining fiber 17 and is arranged on one end side of the optical fiber for a sensor 2. Also, a direction of a crystal axis X51 on each optical surface thereof is set to be in the direction of the X axis at an angle of ±45° to the polarizing directions of the two linearly polarized lights LF and LS incident from the polarization maintaining fiber 17.

Accordingly, the directions of the crystal axes X41 and X51 on the respective optical surfaces of the first quarter-wave plate 4 and the second quarter-wave plate 5 are set to be in the same direction, that is, the direction of the X axis. Also, since the direction of the crystal axis X61 on the optical surface of the polarization splitter 6 is set to be in the direction of the Y axis as described above, the direction of the crystal axis X61 and the direction of the crystal axis X41 are set to be perpendicular to each other.

The Faraday rotator 3 is a light transmissive optical element provided on the periphery thereof with a permanent magnet 3*a*, is made of a bismuth-substituted garnet single crystal, and is arranged between a proximity to a side of one end 2*a* serving as an incident end of the optical fiber for a sensor 2 and the second quarter-wave plate 5. An external shape thereof is processed into a flat plate having opposed light incident and emitting optical surfaces parallel to each other to have a predetermined thickness. The Faraday rotator 3 gives a total phase difference in the reciprocation corresponding to a Faraday rotation angle due to magnetic saturation to one of the two incident circularly polarized lights LC1 and LC2. Meanwhile, FIGS. 4 and 8 omit illustration of the permanent magnet 3*a*.

In the present invention, the Faraday rotation angle at the time of magnetic saturation when the two circularly polarized lights LC1 and LC2 are transmitted is set to be an angle slightly changed from 22.5° at a temperature of 23° C. The reason for setting the temperature for measurement of the Faraday rotation angle to 23° C. is that the present applicant has set the temperature as a temperature at which the Faraday rotation angle can be measured most easily when the Faraday rotation angle is measured at ordinary temperature. Accordingly, the Faraday rotation angle when the circularly polarized light LC1 or LC2 is transmitted through the Faraday rotator 3 once is 22.5°+α°, the amount of the slight change. Thus, the sum of a phase difference between the circularly polarized lights after being transmitted through the second quarter-wave plate 5 and before being transmitted through the Faraday rotator 3 and a phase difference between the circularly polarized lights after being emitted from the optical fiber for a sensor 2 and after being transmitted through the Faraday rotator 3 is twice as much as the Faraday rotation angle, that is, 45°+2α° in total, in a case of not being influenced by measured electric current I. Meanwhile, as for a rotating direction of the Faraday rotation angle, either right rotation i.e. rotation in a clockwise direction or left rotation i.e. rotation in a counterclockwise direction, in a direction of the Z axis may be set arbitrarily, and FIG. 3 illustrates a case of left rotation as an example.

Figure 11:
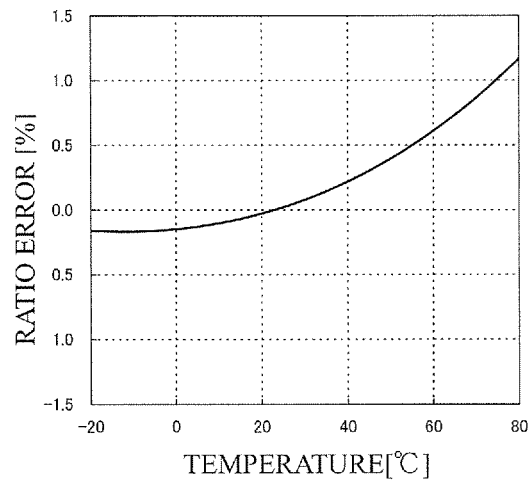
FIG. 11 is a graph schematically illustrating a temperature characteristic of a ratio error in a temperature range between −20° C. or higher and 80° C. or lower in the electric current measuring apparatus including a Faraday rotator having a Faraday rotation angle of 45° at a temperature of 23° C. when a circularly polarized light transmits in a reciprocating manner.
Figure 12:
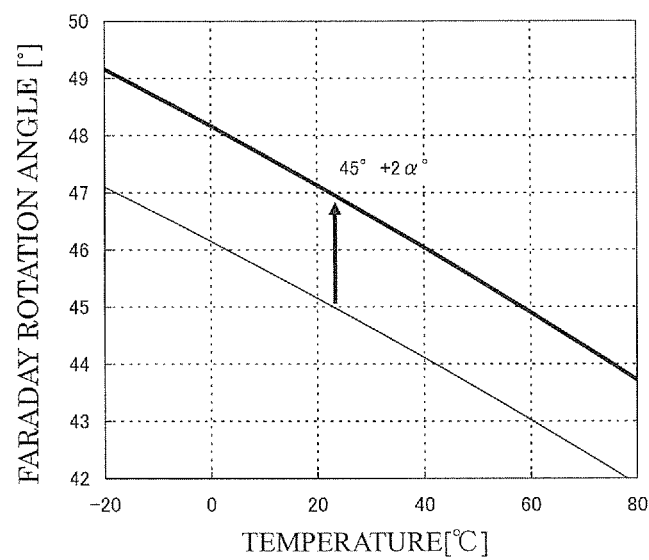
FIG. 12 is a graph schematically illustrating a temperature dependency of the Faraday rotation angle when the Faraday rotation angle at the temperature of 23° C. changed by α° from 22.5° and light transmits in a reciprocating manner.

FIG. 11 is a graph schematically illustrating a temperature characteristic of a ratio error in a temperature range between −20° C. or higher and 80° C. or lower in a measurement value of the measured electric current output from the signal processing circuit of the electric current measuring apparatus having a Faraday rotation angle of 45° at a temperature of 23° C. when a circularly polarized light is transmitted in a reciprocating manner. The reason for setting the temperature range to 100 degrees in the Celsius scale ranging between −20° C. or higher and 80° C. or lower is that the temperature range is a request from a customer of the present applicant.

Figure 13:
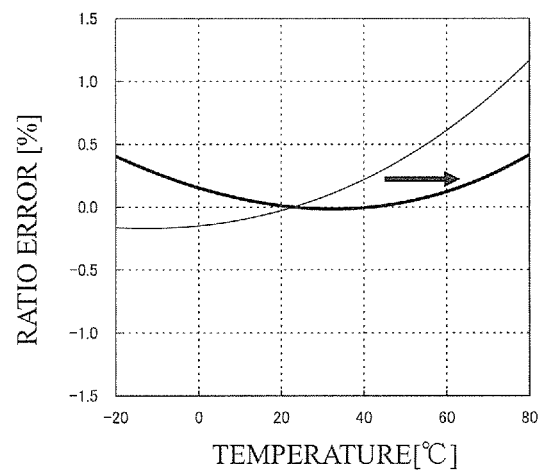
FIG. 13 a graph schematically illustrating the temperature characteristic of the ratio error in the temperature range between −20° C. or higher and 80° C. or lower in the electric current measuring apparatus including the Faraday rotator in when the Faraday rotation angle changed by α° from 22.5° and a curve of the temperature characteristic of the ratio error is shifted to a high temperature side.

As illustrated in FIG. 11, the ratio error in the electric current measuring apparatus increases in a non-linear fashion as the temperature increases. In such a temperature characteristic of the ratio error, by setting the Faraday rotation angle at the temperature of 23° C. to be changed as much as the slight rotation angle α° from 22.5°, the rotation angle is 45°+2α° in the reciprocation as described above as illustrated in FIG. 12. Consequently, as illustrated in FIG. 13, the curve of the temperature characteristic of the ratio error in the electric current measuring apparatus is shifted to a high temperature side. This enables a fluctuation range of the ratio error to be reduced as is apparent from comparison between FIG. 11 and FIG. 13. The rotation angle α° C. an be set arbitrarily within a range in which the fluctuation range of the ratio error is reduced when the curve of the temperature characteristic of the ratio error is shifted. In this manner, by changing the Faraday rotation angle as much as α° from 22.5°, the fluctuation range of the ratio error in the electric current measuring apparatus is reduced.

A lens 16 is arranged between the Faraday rotator 3 and the second quarter-wave plate 5. In the present embodiment, the lens 16 is a single lens, and a focus thereof is set approximately at the center of the core 17*a* on the end surface of the polarization maintaining fiber 17 and approximately at a center of a core at one end 2*a* of the optical fiber for a sensor 2. One end 2a of the optical fiber for a sensor 2 is also an erected surface perpendicular to an optical axis of the optical fiber 2.

The optical fiber for a sensor 2 is provided around the periphery of an electric conductor 18, through which the measured electric current I flows. A kind of a fiber constituting the optical fiber for a sensor 2 is not particularly limited but shall be a birefringent fiber. Among fibers, a lead-glass fiber is suitable for the optical fiber for a sensor 2 since the lead-glass fiber has characteristics of having a small photo-elastic coefficient and having a relatively large Verdet constant, which determines the strength of the Faraday effect.

The optical fiber for a sensor 2 also includes one end 2a into which the two circularly polarized lights LC1 and LC2 having different rotation angles emitted from the Faraday rotator 3 are incident, and the other end thereof for reflecting the incident circularly polarized lights LC1 and LC2. The other end is provided with a mirror 19 as a reflecting member. It is to be noted that the other end may be provided with an arbitrary reflecting member instead of the mirror 19, and examples thereof are a metal having low absorbance and high reflectance to light such as gold, silver, copper, chromium, and aluminum, and a reflecting film such as a dielectric film.

Further, referring to FIG. 1, the electric current measuring apparatus 1 includes the circulator 10, the light source 7, photo diodes (PD) 13a and 13b as a kind of a photoelectric conversion element, amplifiers (A) 21a and 21b, band-pass filters (BPF) 22a and 22b, low-pass filters (LPF) 23a and 23b, dividers 24a and 24b configured to derive a ratio of an alternating-current component to a direct-current component of an electric signal, a polarity inverter 25, and an operator 26.

The photodiode 13a receives the ordinary light LO and outputs a first electric signal in accordance with the light intensity of the LO. The other photodiode 13b receives the extraordinary light LE and outputs a second electric signal in accordance with the light intensity of the LE. The signal processing circuit 8 calculates a current value for the measured electric current I based on the first and second electric signals.

The light source 7 is constituted by a semiconductor laser (LD: laser diode), a light emitting diode (LED), a super luminescent diode (SLD), an ASE light source, or the like and emits a light having a predetermined wavelength $\lambda$.

The circulator 10 may be either a polarization dependent type or a polarization independent type. The circulator 10 converts a light emitted from the light source 7 into a linearly polarized light and lets one linearly polarized light L1 into the first optical fiber 11. The circulator 10 may be constituted by a birefringent element or a 45° Faraday rotator. The circulator 10 may be replaced with a polarization splitting prism or an optical fiber coupler.

Operations of the electric current measuring apparatus 1 configured as above will be described with reference to the drawings. Meanwhile, FIGS. 7(a) to 7(d) and FIGS. 10(e) to 10(h) correspond to polarization states on cross-sections of the respective optical paths illustrated by signs (a) to (h) in FIG. 2. Also, each of FIGS. 7(a) to 7(d) and FIGS. 10(e) to 10(h) illustrates a propagating position on a matrix in which the direction of the X axis is expressed by 1 to 4 while the direction of the Y axis is expressed by a to d. For example, since the propagating position of the linearly polarized light L1 illustrated in FIG. 7(a) is between 2 and 3 in the direction of the X axis and between a and b in the direction of the Y axis on the matrix, such a propagating position is referred to as (2-3, a-b) in the present embodiment.

First, a laser light having a wavelength $\lambda$ emitted from the light source 7 is converted into one linearly polarized light L1 having a polarizing direction parallel to the direction of the X axis by the circulator 10 and is then incident into the first optical fiber 11 (refer to FIGS. 2 and 3).

Since the first optical fiber 11 is a polarization maintaining fiber, the linearly polarized light L1 is propagated to the end surface 11a on one end side of the first optical fiber 11 with the polarizing direction thereof maintained and is emitted from the end surface 11a to the polarization splitter 6 at a propagating position of (2-3, a-b) (refer to FIG. 7(a)).

As described above, since the direction of the crystal axis X61 on the optical surface of the polarization splitter 6 is set to be parallel to the direction of the Y axis, the direction of the crystal axis X61 is perpendicular to the polarizing direction of the linearly polarized light L1. Accordingly, the linearly polarized light L1 is transmitted through the polarization splitter 6 as an ordinary light without causing birefringence inside the polarization splitter 6 and is incident into the first quarter-wave plate 4, maintaining the polarization state at the time of being incident into the polarization splitter 6.

As described above, since the direction of the crystal axis X41 on the optical surface of the first quarter-wave plate 4 is set to be parallel to the direction of the X axis, the direction of the crystal axis X41 corresponds to the polarizing direction of the linearly polarized light L1. Accordingly, the linearly polarized light L1 is transmitted through the first quarter-wave plate 4, maintaining the polarization state at the time of being incident into the first quarter-wave plate 4 and is incident into the end surface of the polarization maintaining fiber 17 by the lens 15.

As described above, the S axis and the F axis serving as the polarization maintaining axes of the polarization maintaining fiber 17 are arranged in the direction at 45° to the X axis and in the direction at 45° to the Y axis. Accordingly, when the linearly polarized light L1 parallel to the X axis is incident into the polarization maintaining fiber 17, the linearly polarized light L1 is split into the respective vector components respectively parallel to the S axis and the F axis according to the light intensity due to the birefringent characteristic of the polarization maintaining fiber 17, and is converted into the two linearly polarized lights LF and LS, and the two linearly polarized lights LF and LS are propagated inside the core 17a (refer to FIGS. 3 and 5). The linearly polarized lights LF and LS are transmitted to the end surface on one end side and are emitted from the end surface to the second quarter-wave plate 5.

When the two linearly polarized lights LF and LS are propagated inside the polarization maintaining fiber 17, a phase difference $\Delta V$ resulting from a difference of the group velocity between the fast axis and the slow axis is generated between the two linearly polarized lights LF and LS. Accordingly, when the linearly polarized lights LF and LS are emitted from the polarization maintaining fiber 17, the LF has a phase difference as much as $\Delta V$ against the LS.

As described above, the direction of the crystal axis X51 on the optical surface of the second quarter-wave plate 5 is set to be in the direction of the X axis. Accordingly, the direction of the crystal axis X51 is arranged at the angle of ±45° to the polarizing directions of the two linearly polarized lights LF and LS incident from the polarization maintaining fiber 17 (refer to FIGS. 6 and 7(b)). Since the F axis has an inclination of −45° against the crystal axis X51, the linearly polarized light LF is converted into the first circularly polarized light LC1 rotated to the left as seen from the incident side of the second quarter-wave plate 5 (in the direction of the Z axis) as illustrated in FIG. 7(c). On the other hand, since the S axis has an inclination of +45° against the crystal axis X51, the linearly polarized light LS is converted into the second circularly polarized light LC2 rotated to the right as seen from the incident side of the second quarter-wave plate 5 (in the direction of the Z axis) as illustrated in FIG. 7(d).

The circularly polarized light LC1, to which the phase difference ΔV is given and which moves ahead, is emitted from the second quarter-wave plate 5 and is then transmitted through the lens 16. Subsequently, when the circularly polarized light LC1 is transmitted through the Faraday rotator 3, the circularly polarized light LC1 is provided with a phase difference of 22.5°+α°. As described above, since the rotating direction of the Faraday rotator 3 is set to left rotation as seen in the direction of the Z axis, the phase difference is given to the circularly polarized light LC1 rotated to the left as seen in the direction of the Z axis so that the circularly polarized light LC1 may be advanced 22.5°+α° with respect to the LC2. After being transmitted through the Faraday rotator 3, the two circularly polarized lights LC1 and LC2 are incident into one end 2a of the optical fiber for a sensor 2.

The two circularly polarized lights LC1 and LC2 incident into the optical fiber for a sensor 2 are propagated inside the sensor optical fiber 2, reach the other end side, are reflected on the mirror 19, and return to one end 2a again (refer to FIG. 2). During such reciprocating propagation of the circularly polarized lights LC1 and LC2 performed by the reflection, the circularly polarized lights LC1 and LC2 are influenced by a magnetic field generated by the measured electric current I. A phase difference φ in accordance with the magnitude of the measured electric current I is generated between the two circularly polarized lights LC1 and LC2 by the Faraday effect. φ is a phase difference between the circularly polarized lights LC1 and LC2 generated in accordance with the measured electric current I by the Faraday effect when the circularly polarized lights LC1 and LC2 reciprocate inside the optical fiber for a sensor 2.

Further, due to birefringence of the optical fiber for a sensor 2, a phase difference is generated between the two circularly polarized lights LC1 and LC2 during the propagation from one end 2a to the other end, and a ratio error caused by this phase difference is also generated. However, the two circularly polarized lights LC1 and LC2 are propagated between one end 2a and the other end in a reciprocating manner by the reflection on the mirror 19. Accordingly, the phase difference generated during outbound propagation from one end 2a to the other end is compensated by a phase difference generated during inbound propagation from the other end to one end 2a. In the above manner, the ratio error along with the birefringence inherent in the optical fiber for a sensor 2 is compensated.

Although the respective rotating directions of the first circularly polarized light LC1 and the second circularly polarized light LC2 do not change before and after the reflection on the mirror 19, the propagating directions are reversed by the reflection. Thus, the respective rotating directions are reversed when the lights are seen in the outbound propagating directions.

Figure 8:
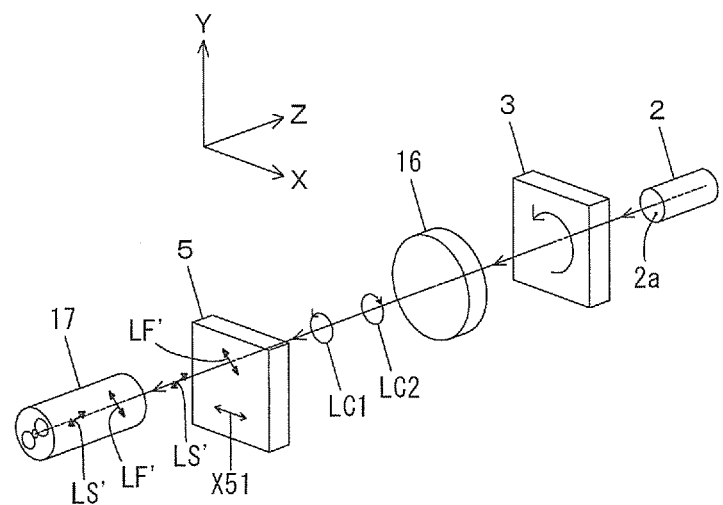
FIG. 8 is a perspective view illustrating arrangement of the respective components from the polarization maintaining fiber to the optical fiber for a sensor and a polarization state of light on an inbound path in the electric current measuring apparatus in FIG. 2.

The two reflected circularly polarized lights LC1 and LC2 are propagated into the optical fiber for a sensor 2 again and are then emitted from one end 2a of the optical fiber for a sensor 2 into the Faraday rotator 3 (refer to FIGS. 2 and 8).

The circularly polarized lights LC1 and LC2 are incident into the Faraday rotator 3 from the side or direction of the optical fiber for a sensor 2 (in a direction of a −Z axis). Also, the rotating directions of the respective circularly polarized lights LC1 and LC2 in the outbound propagating directions are reversed on the outbound path and the inbound path by the reflection on the mirror 19. Accordingly, when the two circularly polarized lights LC1 and LC2 are transmitted through the Faraday rotator 3 again, the circularly polarized light LC1 is provided with the phase difference of 22.5°+α° again. In the above manner, a phase difference between the two circularly polarized lights LC1 and LC2 after being emitted from the optical fiber for a sensor 2 and being transmitted through the Faraday rotator 3 increases (45°+2α°+φ+ΔV) more than the phase difference between the two circularly polarized lights LC1 and LC2 before being transmitted through the Faraday rotator 3 on the outbound path.

After being transmitted through the Faraday rotator 3, the two circularly polarized lights LC1 and LC2 are transmitted through the lens 16 and are incident into the second quarter-wave plate 5 again (refer to FIGS. 8, 10(e), and 10(f)). Since the circularly polarized light LC1 is a circularly polarized light rotated to the right when the light is seen in the direction of the −Z direction as the propagating direction, the circularly polarized light LC1 is converted into a linearly polarized light LS' having the polarizing direction in the direction of the S axis by the second quarter-wave plate 5. On the other hand, since the circularly polarized light LC2 is a circularly polarized light rotated to the left when the light is seen in the direction of the −Z direction, the circularly polarized light LC2 is converted into a linearly polarized light LF' having the polarizing direction in the direction of the F axis by the second quarter-wave plate 5 (refer to FIGS. 8 and 10(g)).

Figure 9:
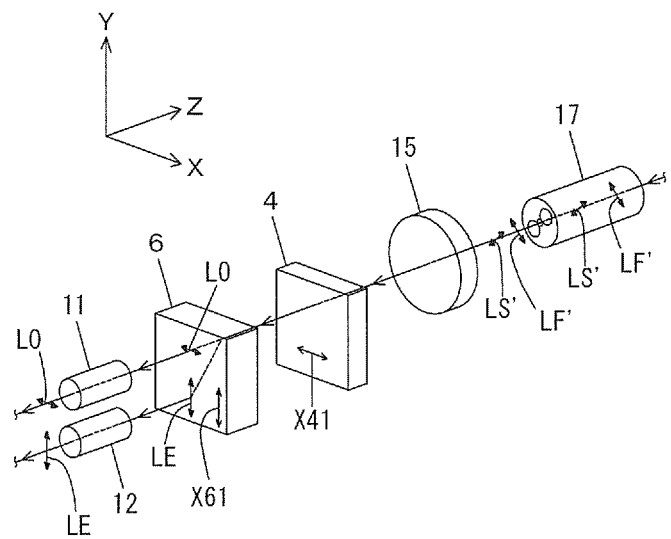
FIG. 9 is a perspective view illustrating arrangement of the respective components from the light incident and emitting unit to the polarization maintaining fiber and a polarization state of light on the inbound path in the electric current measuring apparatus in FIG. 2.
Figure 10:
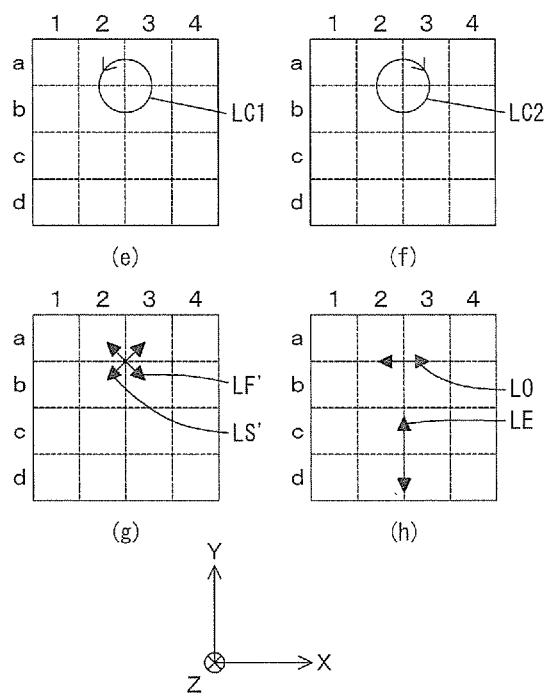
FIG. 10 illustrates polarization states of propagation lights from reflection on the other end of the optical fiber for a sensor until incidence into first and second optical fibers in the electric current measuring apparatus in FIG. 2.

The two linearly polarized lights LF' and LS' are incident into the end surface of the polarization maintaining fiber 17 by the lens 16 and are propagated inside the polarization maintaining fiber 17 to the other end side (refer to FIG. 9). The linearly polarized light LF' is incident so that the polarizing direction thereof may be parallel to the F axis (fast axis) of the polarization maintaining fiber 17 while the linearly polarized light LS' is incident so that the polarizing direction thereof may be parallel to the S axis (slow axis) of the polarization maintaining fiber 17. Thus, the two linearly polarized lights LF' and LS' are propagated inside the polarization maintaining fiber 17 to the side of the first quarter-wave plate 4, maintaining the respective polarizing directions without being split further.

As described above, the phase difference ΔV resulting from the difference of the group velocity in the polarization maintaining fiber 17 is given between the two linearly polarized lights LF and LS on the outbound path (in the direction of the Z axis). However, on the inbound path (in the direction of the −Z axis), the LS becomes the linearly polarized light LF' in the direction of the F axis while the LF becomes the linearly polarized light LS' in the direction of the S axis. Thus, on the inbound path, the LF' has a phase difference as much as ΔV against the LS'. In other words, the linearly polarized light LF, which has the phase difference ΔV on the outbound path, has a phase difference −ΔV on the inbound path. Accordingly, by reciprocation of the two linearly polarized lights inside the polarization maintaining fiber 17, the phase difference in the polarization maintaining fiber 17 is compensated. In the above manner, the phase difference between the two linearly polarized lights in the polarization maintaining fiber 17, which is a reciprocating optical path between the first quarter-wave plate 4 and the second quarter-wave plate 5, is compensated. Thus, on the inbound path, a phase difference between the two linearly polarized lights LF' and LS' at the time of being emitted from the polarization maintaining fiber 17 is (45°+2α°+φ).

The two linearly polarized lights LF' and LS' propagated to the end surface on one end side of the polarization maintaining fiber 17 are emitted from the end surface via the lens 15 into the first quarter-wave plate 4 and are transmitted through the first quarter-wave plate 4 to be combined into one light. Since the phase difference between the two linearly polarized lights LF' and LS' is (45°+2α°+φ), the combined light is an elliptically polarized light with a long axis thereof inclined against the Y axis. A ratio of the long axis component to the short axis component of this elliptically polarized light changes depending on the phase difference 4. Such an elliptically polarized light is incident into the polarization splitter 6.

A combined light incident into the polarization splitter 6 is split into the ordinary light LO and the extraordinary light LE perpendicular to each other (refer to FIGS. 2, 9, and 10(h)). The light intensities of the ordinary light LO and the extraordinary light LE change depending on the phase difference φ. The light intensities are illustrated to be high in FIGS. 9 and 10(h) for easy viewing. Since the direction of the crystal axis X61 is set to be in the direction of the Y axis, the direction of the crystal axis X61 is perpendicular to the polarizing direction of the ordinary light LO. Accordingly, the ordinary light LO is transmitted through the polarization splitter 6, maintaining the propagating position of (2-3, a-b) as illustrated in FIG. 10(h), without causing birefringence inside the polarization splitter 6 and is incident into the first optical fiber 11. On the other hand, since the extraordinary light LE is parallel to the direction of the crystal axis X61, the extraordinary light LE is shifted to a propagating position of (2-3, c-d) in the polarization splitter 6 as illustrated in FIG. 10(h) and is incident into the second optical fiber 12.

The linearly polarized light of the ordinary light LO incident into the first optical fiber 11 is guided to the circulator 10 and is received in the photoelectric conversion element 13a. On the other hand, the linearly polarized light of the extraordinary light LE incident into the second optical fiber 12 is received in the photoelectric conversion element 13b.

Figure 14:
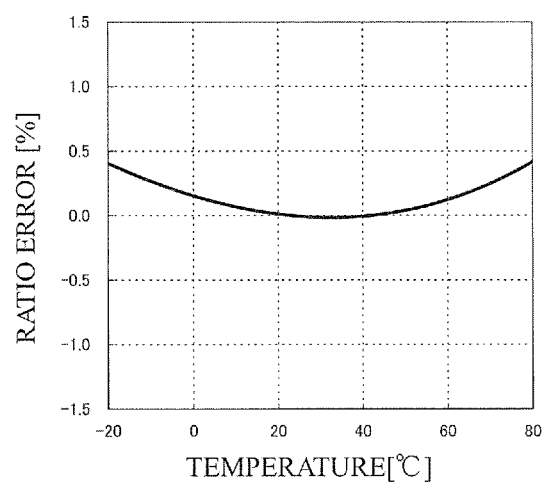
FIG. 14 is a graph illustrating an example of a temperature characteristic of the ratio error in a measurement value of a measured electric current output from a signal processing circuit in the electric current measuring apparatus according to the embodiment of the present invention.

The two linearly polarized lights are converted into the first and second electric signals by the photoelectric conversion elements 13a and 13b, and the electric signals are input into the signal processing circuit 8. The average of the degrees of modulation (alternating current component/direct current component) of the two electric signals is calculated and is converted into an electric quantity, thereby obtaining a current value for the measured electric current I. FIG. 14 illustrates an example of a temperature characteristic graph of the ratio error in the measurement value of the measured electric current I output from the signal processing circuit 8 in the electric current measuring apparatus 1.

In the present invention, as illustrated in FIG. 14, the fluctuation range of the ratio error in the measurement value of the measured electric current I output from the signal processing circuit 8 is set within a range of ±0.5%. Also, ±0.5% is achieved through the temperature range of 100 degrees in the Celsius scale (between −20° C. or higher and 80° C. or lower). The reason for setting the temperature range to 100 degrees in the Celsius scale ranging between −20° C. or higher and 80° C. or lower is that practicality to cover the normal temperature range, which ranges from −10° C. or higher and 40° C. or lower, is taken into consideration. According to the present invention, the setting of the fluctuation range of the ratio error within ±0.5% is performed by adjustment of the rotation angle of the Faraday rotator 3, compensation for the ratio error along with the birefringence inherent in the optical fiber for a sensor 2, and compensation for the phase difference between the two linearly polarized lights in the reciprocating optical path between the first quarter-wave plate 4 and the second quarter-wave plate 5, as described above.

As described above, according to the present invention, in addition to the change of the rotation angle of the Faraday rotator 3 as much as α° from 22.5° at the temperature of 23° C. to reduce the fluctuation range of the ratio error in the electric current measuring apparatus 1, the ratio error along with the birefringence inherent in the optical fiber for a sensor 2 is compensated, and the phase difference between the two linearly polarized lights in the reciprocating optical path between the first quarter-wave plate 4 and the second quarter-wave plate 5 is compensated. Accordingly, all of the phase differences other than the phase difference of the rotation angle of the Faraday rotator 3 are compensated except the phase difference φ caused by the Faraday effect in the optical fiber for a sensor 2 and do not appear in the output of the electric current measuring apparatus 1. Consequently, since the fluctuation range of the ratio error resulting from the birefringence of the optical fiber for a sensor (approximately −0.1% to approximately 1.2%) is compensated, and the phase difference between the two linearly polarized lights in the reciprocating optical path between the first quarter-wave plate 4 and the second quarter-wave plate 5 is compensated, the fluctuation range of the ratio error in the output of the electric current measuring apparatus 1 can be set within ±0.5% reliably.

Also, since the phase differences other than the phase difference of the rotation angle of the Faraday rotator 3 are compensated except the phase difference 4, the output of the electric current measuring apparatus 1 is not influenced by phase changes at the time of light propagation due to application of disturbances such as vibration and temperature fluctuation to the polarization maintaining fiber 17 and the optical fiber for a sensor 2. Accordingly, an output characteristic of the electric current measuring apparatus 1 can be stabilized.

Further, by suppressing the fluctuation range of the ratio error in the output of the electric current measuring apparatus 1 to be within ±0.5% in the temperature range between −20° C. or higher and 80° C. or lower, reliability of the electric current measuring apparatus is improved. Also, by suppressing the fluctuation range of the ratio error to be within ±0.5%, it is possible to achieve the electric current measuring apparatus which can be applied to a protection relay.

Still further, the directions of the crystal axes X41 and X51 on the respective optical surfaces of the two quarter-wave plates 4 and 5 are set to be in equal directions. Accordingly, even in a case in which the number of components increases as much as the two quarter-wave plates 4 and 5 when the electric current measuring apparatus 1 using circularly polarized lights is constituted, no adjusting operation of the angles of the crystal axes of the quarter-wave plates and no installing operation of the quarter-wave plates are required. Thus, with the electric current measuring apparatus 1 according to the present invention, high function of suppressing the fluctuation range of the ratio error to be within ±0.5% and facilitation of assembling can be achieved at the same time.

Meanwhile, in the electric current measuring apparatus 1 according to the present invention, the direction of the crystal axis X61 of the polarization splitter 6 is required to be set perpendicular to the direction of the crystal axis X41 of the first quarter-wave plate 4. However, since a fine angle adjusting operation is not required in comparison with a case of setting the directions at an angle of 45°, for example, an assembling operation of the polarization splitter 6 and the first quarter-wave plate 4 can be performed easily.

Figure 16:
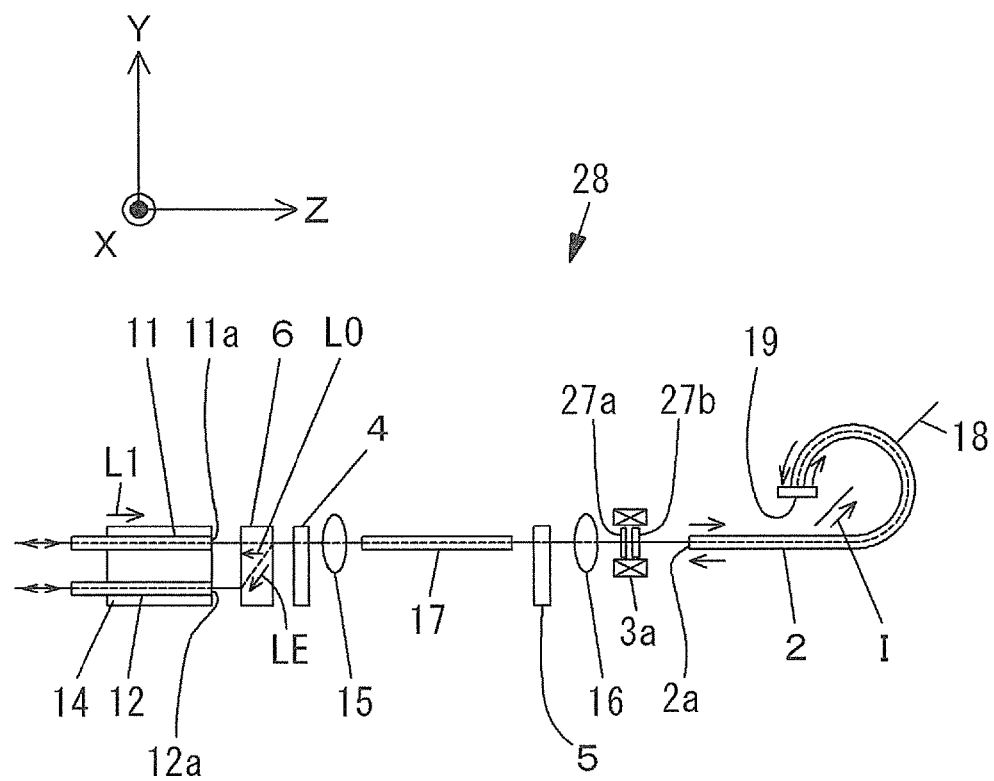
FIG. 16 is a configuration diagram illustrating another mode of an electric current measuring apparatus according to FIG. 2.

Meanwhile, the electric current measuring apparatus 1 can be changed to an electric current measuring apparatus 28 in which the Faraday rotator 3 is constituted by two Faraday elements 27a and 27b having different Faraday rotation angles, for example, as illustrated in FIG. 16. In the electric current measuring apparatus 28, the total Faraday rotation angle at the time of magnetic saturation when the two circularly polarized lights LC1 and LC2 are transmitted through the two Faraday elements 27a and 27b in the reciprocation is set to be an angle slightly changed from 45°. That is, the total Faraday rotation angle when each of the two circularly polarized lights LC1 and LC2 is transmitted through the two Faraday elements 27a and 27b once may be set to be 22.5°+α°, the amount of the slight change. It is to be noted that the number of the Faraday elements is not limited to two, and the Faraday rotator 3 may be constituted by three or more Faraday elements.

Figure 17:
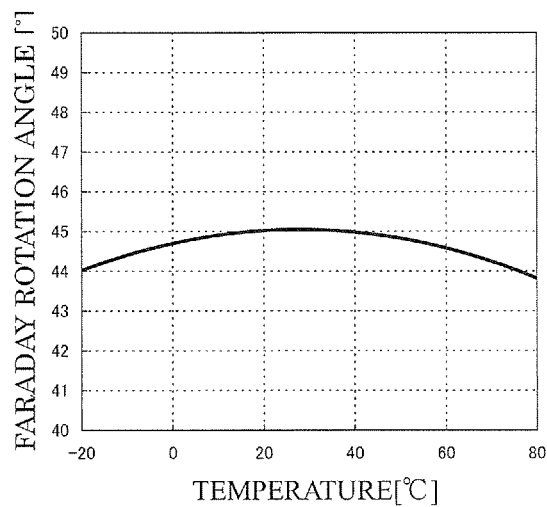
FIG. 17 is a graph schematically illustrating the temperature characteristic of the Faraday rotation angle of a first Faraday element.
Figure 18:
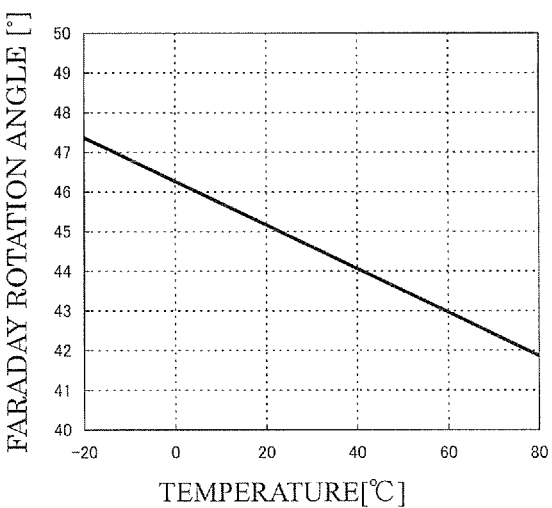
FIG. 18 is a graph schematically illustrating the temperature characteristic of the Faraday rotation angle of a second Faraday element.
Figure 19:
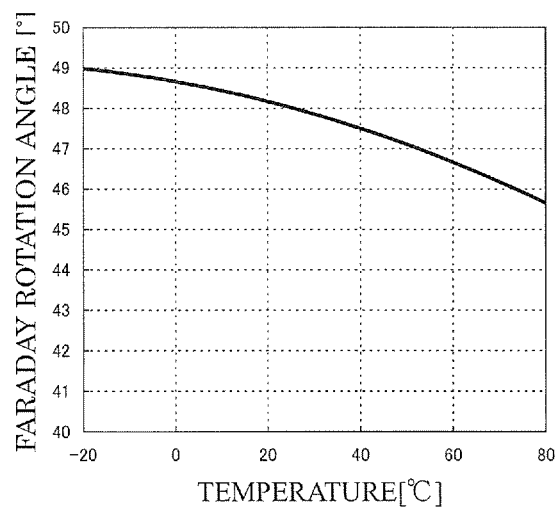
FIG. 19 is a graph illustrating the temperature characteristic of the Faraday rotation angle in which the temperature characteristics of the Faraday rotation angles shown in FIGS. 17 and 18 are combined.

FIGS. 17 and 18 are graphs schematically illustrating temperature characteristics of the Faraday rotation angles of the Faraday elements 27a and 27b, respectively. Additionally, FIG. 19 illustrates a temperature characteristic of the Faraday rotation angle when the temperature characteristics of the Faraday rotation angles of the respective Faraday elements are combined. As illustrated in FIG. 17, the rotation angle of the first Faraday element 27a has a quadratically-curved temperature dependency. Also, as is apparent from FIG. 18, the rotation angle of the second Faraday element 27b decreases uniformly in inverse proportion to the temperature increase in a temperature range between −20° C. or higher and 80° C. or lower. Consequently, when the temperature characteristics of the Faraday rotation angles of the first Faraday element 27a and the second Faraday element 27b are combined, the temperature characteristic of the Faraday rotation angle decreasing in a quadratically-curved manner along with the temperature increase is revealed as illustrated in FIG. 19. Accordingly, by suppressing the fluctuation range of the ratio error in the measurement value of the measured electric current I to be within ±0.2% in the temperature range between −20° C. or higher and 80° C. or lower, the electric current measuring apparatus can be used for application in which the temperature characteristic of the ratio error within ±0.2% is required (e.g., an electric energy meter for measuring an electric rate which requires strict measurement).

Figure 15:
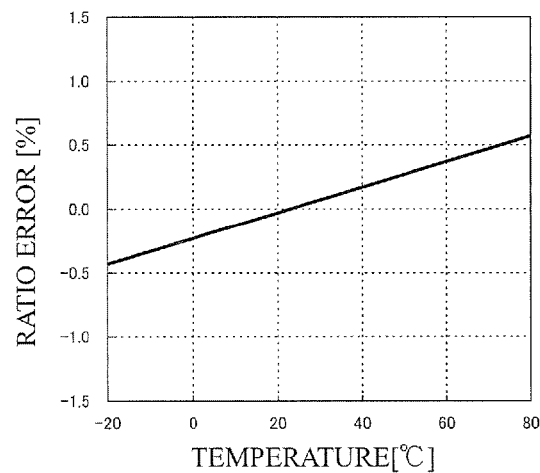
FIG. 15 is a graph schematically illustrating the temperature characteristic of the ratio error of a lead-glass fiber which is used as the optical fiber for a sensor for the sensor.
Figure 20:
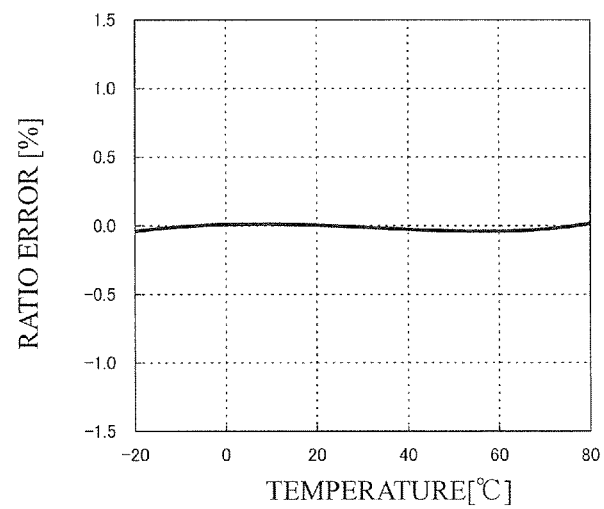
FIG. 20 is a graph illustrating an example of the temperature characteristic of the ratio error of the electric current measuring apparatus in the measurement value of a measured electric current obtained from the temperature dependency of the Faraday rotation angle shown in FIG. 19.

As illustrated in FIG. 15, the temperature characteristic of the ratio error of the lead-glass fiber which is used as the optical fiber for a sensor 2 increases uniformly in proportion to the temperature increase. Accordingly, by providing the Faraday elements 27a and 27b with the decrease in the Faraday rotation angle in the high temperature range and performing compensation for the birefringence of the optical fiber for a sensor 2 and compensation for the phase difference between the two linearly polarized lights in the reciprocating optical path between the two quarter-wave plates 4 and 5, when the temperature characteristic of the ratio error of the lead-glass fiber which is used as the optical fiber for a sensor 2 is added, the decrease in the Faraday rotation angle in the high temperature range compensates for the change in the ratio error of the lead-glass fiber. Thus, as illustrated in FIG. 20, it becomes possible to suppress the fluctuation range of the ratio error in the measurement value of the measured electric current I output from the signal processing circuit 8 to be within ±0.5% (or ±0.2%) in the temperature range between −20° C. or higher and 80° C. or lower.

When the electric current measuring apparatus 1 and the electric current measuring apparatus 28 are compared in terms of the configuration, the number of the Faraday rotators 3 can be one in the electric current measuring apparatus 1. Thus, it is possible to simplify the configuration of the electric current measuring apparatus as much, and it becomes easy to adjust the fluctuation range of the ratio error in the measurement value of the measured electric current I output from the signal processing circuit 8. For the above-described reasons, the electric current measuring apparatus 1 is the most preferred embodiment.

However, when it is difficult to stably create the garnet single crystal having a desired rotation angle due to the composition of the garnet of the Faraday rotator 3, the Faraday rotator 3 may be constituted by two or more Faraday elements. When the Faraday rotator 3 is constituted by two or more Faraday elements, the Faraday rotation angles of the Faraday elements are different from each other, thereby setting the temperature characteristic of each Faraday element to a desired characteristic.

By suppressing the fluctuation range of the ratio error in the measurement value of the measured electric current I to be within ±0.2% in the temperature range between −20° C. or higher and 80° C. or lower, the electric current measuring apparatus can be used for application in which the temperature characteristic of the ratio error within ±0.2% is required (e.g., an electric energy meter for measuring an electric rate which requires strict measurement).

The lead-glass fiber which is used as the optical fiber for a sensor 2 has the temperature characteristic of the ratio error as illustrated in FIG. 15. Thus, when the rotation angle of the Faraday rotator 3 is changed as much as α° from 22.5° to reduce the fluctuation range of the ratio error in the electric current measuring apparatus 1, the temperature characteristic of the ratio error of the lead-glass fiber is added, and the angle of α° is adjusted so that the fluctuation range of the ratio error in the measurement value of the measured electric current I output from the signal processing circuit 8 may be set within ±0.5% (or ±0.2%) in the temperature range between −20° C. or higher and 80° C. or lower. Accordingly, even when the lead-glass fiber is used for the optical fiber for a sensor 2, it is possible to suppress the fluctuation range of the ratio error in the measurement value of the measured electric current I output from the signal processing circuit 8 to be within ±0.5% (or ±0.2%).

Meanwhile, the present invention can be altered in various ways by a technical idea thereof. For example, the optical fiber for a sensor 2 may be a quartz glass fiber. Accordingly, since the electric current measuring apparatus according to the present invention can be achieved broadly regardless of the kind of the optical fiber for a sensor, the yield ratio of the electric current measuring apparatus can also be improved. Also, the first optical fiber 11 may be changed to a single-mode optical fiber.

Figure 22:
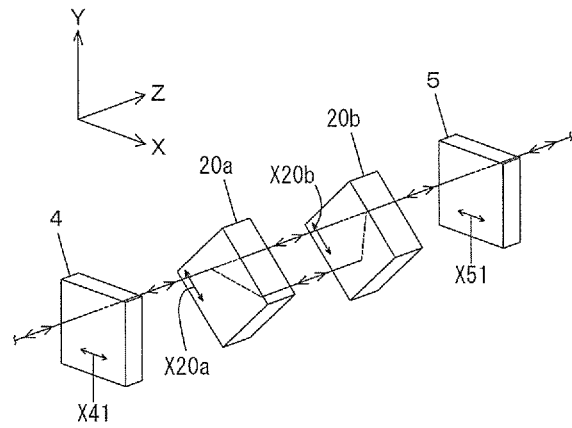
FIG. 22 is a perspective view illustrating another form of a reciprocating optical path between a first quarter-wave plate and the second quarter-wave plate in FIG. 2.

Also, the reciprocating optical path between the first quarter-wave plate 4 and the second quarter-wave plate 5 through which the two linearly polarized lights are propagated is not limited to the polarization maintaining fiber 17 and may be constituted by two birefringent elements 20a and 20b as illustrated in FIG. 22, for example, in which directions of crystal axes X20a and X20b on the optical surfaces as seen in the direction of the Z axis correspond, and in which directions in which the extraordinary light is shifted are set to be reversed. It is to be noted that the lens 15 is omitted in FIG. 22.

The directions of the crystal axes X41 and X51 on the respective optical surfaces of the first quarter-wave plate 4 and the second quarter-wave plate 5 may be set to be perpendicular to each other. Although each of the crystal axes X41 and X51 is set in the direction of the X axis in the embodiment in FIGS. 3 and 4, only the direction of the crystal axis X41 may be changed to be parallel to the direction of the Y axis, for example. Alternatively, the direction of the crystal axis X41 may be set to be in the direction of the X axis while only the direction of the crystal axis X51 may be changed to be parallel to the direction of the Y axis.

Even in the case in which the directions of the crystal axes X41 and X51 are set to be perpendicular to each other, a fine adjusting operation of angles of the directions of the crystal axes X41 and X51 is not required in comparison with a case of setting the directions at an angle of 45° therebetween. Accordingly, an assembling operation of the two quarter-wave plates 4 and 5 can be performed easily.

When the directions of the crystal axes X41 and X51 are set to be perpendicular to or parallel to each other, care must be taken so that the direction of the crystal axis X41 may be perpendicular to or parallel to the polarizing direction of the linearly polarized light L1 and so that the direction of the crystal axis X51 may be at an angle of ±45° to the respective polarizing directions of the two linearly polarized lights LF and LS.

Figure 23:
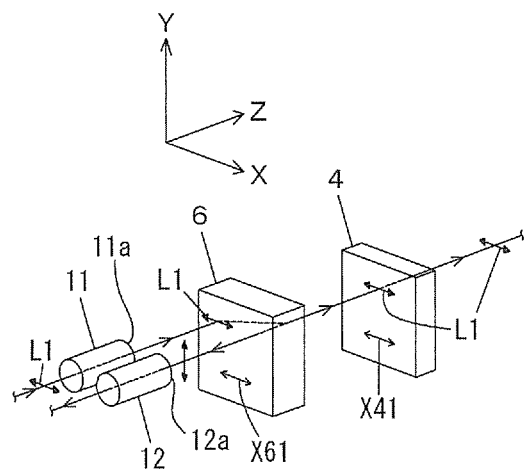
FIG. 23 is a perspective view illustrating a modification example of the electric current measuring apparatus according to an embodiment of the present invention.

Also, as illustrated in FIG. 23, the direction of the crystal axis X61 on the optical surface of the polarization splitter 6 and the direction of the crystal axis X41 on the optical surface of the first quarter-wave plate 4 may be changed to be in an equal direction. In the configuration example illustrated in FIG. 23, the direction of the crystal axis X61 is set to be in the direction of the X axis. In this case, since the linearly polarized light L1 propagated through the first optical fiber 11 is incident into the polarization splitter 6 as the extraordinary light, the position of the end surface 11a of the first optical fiber 11 has only to be changed as much as the shift amount in the polarization splitter 6 in advance. At the same time, the position of the second optical fiber 12 has only to be changed so that the end surface 12a may be located at the position of the end surface 11a of the first optical fiber 11 in FIG. 3.

In this manner, by setting the direction of the crystal axis X61 on the optical surface of the polarization splitter 6 and the direction of the crystal axis X41 on the optical surface of the first quarter-wave plate 4 in the equal direction, no adjusting operation of the angles of the crystal axes of the polarization splitter 6 and the first quarter-wave plate 4 and no installing operation of the polarization splitter 6 and the first quarter-wave plate 4 are required. Thus, an assembling operation of the polarization splitter 6 and the first quarter-wave plate 4 can further be facilitated.

Further, by setting the direction of the crystal axis X61 on the optical surface of the polarization splitter 6 and the directions of the crystal axes X41 and X51 on the optical surfaces of the two quarter-wave plates 4 and 5 in the equal direction, no adjusting operation of the angles of the crystal axes of the polarization splitter 6 and the two quarter-wave plates 4 and 5 and no installing operation of the polarization splitter 6 and the two quarter-wave plates 4 and 5 are required. Thus, an assembling operation of the polarization splitter 6 and the two quarter-wave plates 4 and 5 can further be facilitated.

EXAMPLES

Hereinbelow, examples of the present invention will be described. However, the present invention is not limited to the foregoing examples. It is to be noted that, in each of Examples 1 to 3, a lead-glass fiber is used for the optical fiber for a sensor 2, and a reciprocating optical path between the first quarter-wave plate 4 and the second quarter-wave plate 5 is constituted by a polarization maintaining fiber (PMF). Also, the directions of the crystal axes X41 and X51 on the optical surfaces of the two quarter-wave plates 4 and 5 are set to be in the direction of the X axis, and the direction of the crystal axis X61 of the change splitter 6 is set to be in the direction of the Y axis.

Example 1

Figure 24:
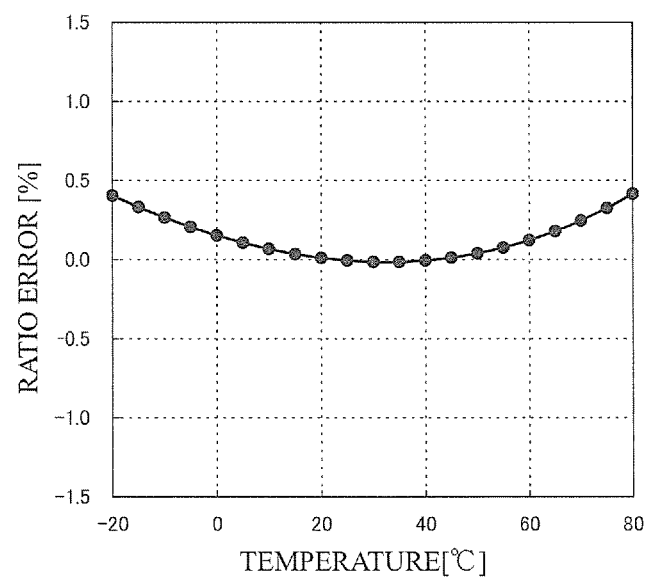
FIG. 24 is a graph illustrating the temperature characteristic of the ratio error in Example 1 of the electric current measuring apparatus of the present invention.

An example is described in which magnetic garnet which is used for an optical isolator and has the temperature characteristic of the Faraday rotation angle illustrated in FIG. 14 is used as the Faraday rotator 3 in FIG. 2. A Faraday rotator having a Faraday rotation angle of 22.5°+1.0° at the temperature of 23° C. was used. That is, α=1.0° was set, and the total Faraday rotation angle at the time of magnetic saturation when the circularly polarized lights LC1 and LC2 were transmitted in a reciprocating manner was set to 47.0°. Table 1 and FIG. 24 show the temperature characteristic of the ratio error in the measurement value of the measured electric current I output from the signal processing circuit of the electric current measuring apparatus 1 having the above Faraday rotator 3. In Table 1, "Faraday rotation angle" is the total Faraday rotation angle at the time of magnetic saturation when the circularly polarized lights LC1 and LC2 are transmitted in a reciprocating manner, and "ratio error" in Table 1 is the ratio error in the measurement value of the measured electric current I output from the signal processing circuit of the electric current measuring apparatus 1. Hereinbelow, the same is applied to Examples 2 and 3.

TABLE 1

| Temperature T [° C.] | Rotation Angle [deg] | Ratio Error [%] |
| --- | --- | --- |
| −20 | 49.21 | 0.40 |
| −15 | 48.96 | 0.33 |
| −10 | 48.72 | 0.27 |
| −5 | 48.47 | 0.21 |
| 0 | 48.21 | 0.15 |
| 5 | 47.96 | 0.11 |
| 10 | 47.70 | 0.07 |
| 15 | 47.44 | 0.04 |
| 20 | 47.17 | 0.01 |
| 25 | 46.91 | −0.01 |
| 30 | 46.63 | −0.01 |
| 35 | 46.36 | −0.01 |
| 40 | 46.08 | −0.01 |
| 45 | 45.80 | 0.01 |
| 50 | 45.52 | 0.04 |
| 55 | 45.24 | 0.08 |
| 60 | 44.95 | 0.12 |
| 65 | 44.66 | 0.18 |
| 70 | 44.36 | 0.25 |
| 75 | 44.06 | 0.33 |
| 80 | 43.76 | 0.42 |

As is apparent from Table 1 and FIG. 24, in a case in which the number of Faraday rotators is one, and in which α=1.0° is set, the ratio error can fall within −0.01 to 0.42%, setting 23° C. as a standard. That is, the fluctuation range of the ratio error falls within 0.43% through the temperature range between −20° C. or higher and 80° C. or lower.

Example 2

The temperature dependency of the rotation angle of the magnetic garnet in the reciprocation was expressed by the following quadratic expression (Equation 1), a minimum value of the ratio error fluctuation range for a coefficient a and a coefficient b was calculated. A coefficient c was set so that the ratio error fluctuation range might have the minimum value. The relation between the ratio error fluctuation range and the coefficients a and b is shown in Table 2. Also, the relation between the adjustment amount α° of the Faraday rotation angle and the coefficients a and b at the temperature of 23° when the ratio error fluctuation range has the minimum value as in Table 2 is shown in Table 3.

$$\theta_F = a \cdot T^2 + b \cdot T + c \quad \text{[Equation 1]}$$

where T is a temperature [° C.]

which is an upward projecting curve and in which the rotation angle decreases as the temperature increases, the signs of the coefficient a and the coefficient b are negative. From the above, in order to reduce the ratio error fluctuation range, it is apparent that the coefficient a and the coefficient b of the characteristics of the temperature and of the rotation angle of the magnetic garnet are respectively close to −0.0001 and −0.02. In this case, the rotation angle adjustment amount α° becomes about 1.66°.

Figure 25:
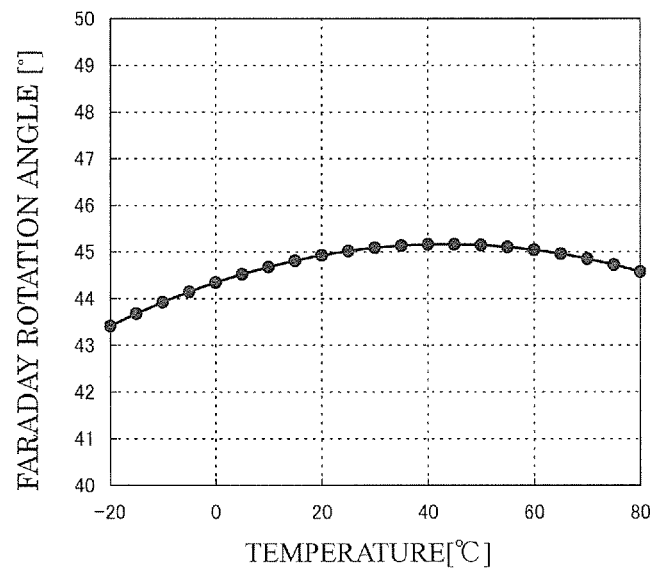
FIG. 25 is a graph illustrating an example of a temperature characteristic of the Faraday rotation angle of a Faraday element 27a in Example 2 of the electric current measuring apparatus of the present invention.
Figure 26:
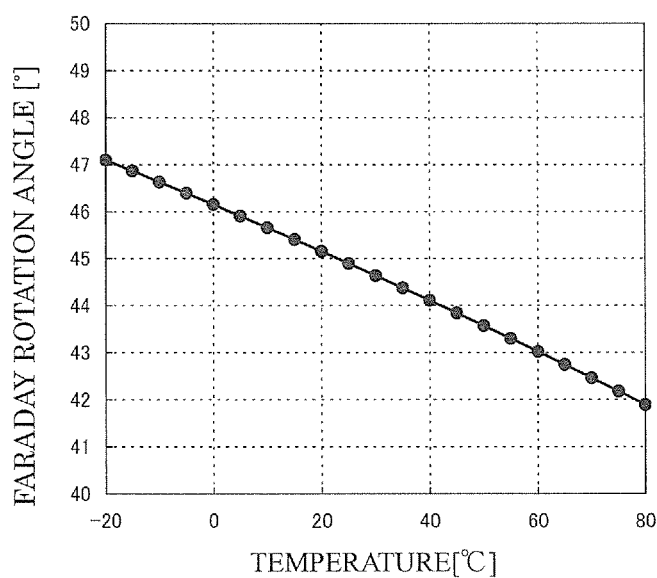
FIG. 26 is a graph illustrating an example of a temperature characteristic of the Faraday rotation angle of a Faraday element 27b in Example 2 of the electric current measuring apparatus of the present invention.

In order to achieve the coefficients a and b for reduction of the ratio error fluctuation range, an example in which the two Faraday elements 27a and 27b illustrated in FIG. 16 are provided will be described. Magnetic garnet having a temperature dependency in a quadratically-curved manner was used as the Faraday element 27a in FIG. 16, and magnetic garnet illustrated in FIG. 26 was used as the Faraday element 27b. The temperature dependencies of the Faraday elements 27a and 27b having the Faraday rotation angle of 45° at the temperature of 23° C. are illustrated in FIGS. 25 and 26.

TABLE 2

| Ratio Error Fluctuation Range | | Secondary Coefficient a | | | | | | | | | | |
|---|---|---|---|---|---|---|---|---|---|---|---|---|
| | | −0.0005 | −0.0004 | −0.0003 | −0.0002 | −0.0001 | 0.0000 | 0.0001 | 0.0002 | 0.0003 | 0.0004 | 0.0005 |
| Primary Coefficient b | −0.06 | 1.12% | 0.98% | 0.86% | 0.73% | 0.64% | 0.56% | 0.50% | 0.46% | 0.44% | 0.44% | 0.49% |
| | −0.05 | 0.85% | 0.73% | 0.61% | 0.51% | 0.44% | 0.39% | 0.36% | 0.35% | 0.38% | 0.45% | 0.60% |
| | −0.04 | 0.61% | 0.50% | 0.40% | 0.34% | 0.27% | 0.26% | 0.26% | 0.29% | 0.39% | 0.60% | 0.80% |
| | −0.03 | 0.39% | 0.30% | 0.22% | 0.17% | 0.13% | 0.14% | 0.20% | 0.32% | 0.60% | 0.85% | 1.00% |
| | −0.02 | 0.25% | 0.17% | 0.09% | 0.05% | 0.03% | 0.06% | 0.21% | 0.60% | 0.94% | 0.90% | 0.80% |
| | −0.01 | 0.23% | 0.22% | 0.20% | 0.18% | 0.12% | 0.02% | 0.60% | 0.90% | 0.73% | 0.65% | 0.60% |
| | 0.00 | 0.40% | 0.40% | 0.41% | 0.41% | 0.42% | 1.00% | 0.42% | 0.41% | 0.41% | 0.40% | 0.40% |
| | 0.01 | 0.60% | 0.65% | 0.73% | 0.90% | 0.60% | 0.02% | 0.12% | 0.18% | 0.20% | 0.22% | 0.23% |
| | 0.02 | 0.80% | 0.90% | 0.94% | 0.60% | 0.21% | 0.06% | 0.03% | 0.05% | 0.09% | 0.17% | 0.25% |
| | 0.03 | 1.00% | 0.85% | 0.60% | 0.32% | 0.20% | 0.14% | 0.13% | 0.17% | 0.22% | 0.30% | 0.39% |
| | 0.04 | 0.80% | 0.60% | 0.39% | 0.29% | 0.26% | 0.26% | 0.27% | 0.34% | 0.40% | 0.50% | 0.61% |
| | 0.05 | 0.60% | 0.45% | 0.38% | 0.35% | 0.36% | 0.39% | 0.44% | 0.51% | 0.61% | 0.73% | 0.85% |
| | 0.06 | 0.49% | 0.44% | 0.44% | 0.46% | 0.50% | 0.56% | 0.64% | 0.73% | 0.86% | 0.98% | 1.12% |

TABLE 3

| α [°] | | Secondary Coefficient a | | | | | | | | | | |
|---|---|---|---|---|---|---|---|---|---|---|---|---|
| | | −0.0005 | −0.0004 | −0.0003 | −0.0002 | −0.0001 | 0 | 0.0001 | 0.0002 | 0.0003 | 0.0004 | 0.0005 |
| Primary Coefficient b | −0.06 | 1.08 | 0.97 | 0.91 | 0.81 | 0.75 | 0.70 | 0.65 | 0.59 | 0.59 | 0.63 | 0.73 |
| | −0.05 | 1.13 | 1.07 | 0.97 | 0.91 | 0.86 | 0.80 | 0.80 | 0.84 | 0.89 | 1.08 | 1.13 |
| | −0.04 | 1.23 | 1.12 | 1.07 | 1.06 | 1.01 | 1.00 | 1.10 | 1.19 | 1.49 | 1.48 | 0.57 |
| | −0.03 | 1.28 | 1.27 | 1.22 | 1.21 | 1.26 | 1.35 | 1.60 | 1.99 | 2.04 | 0.78 | −1.38 |
| | −0.02 | 1.38 | 1.32 | 1.37 | 1.46 | 1.66 | 2.05 | 2.75 | 3.09 | 1.19 | −1.52 | −1.48 |
| | −0.01 | 1.58 | 1.67 | 1.82 | 2.11 | 2.66 | 4.00 | 6.00 | −2.61 | −2.07 | −1.82 | −1.58 |
| | 0.00 | 1.83 | 2.17 | 2.62 | 3.61 | 6.51 | 0.00 | −6.51 | −3.61 | −2.62 | −2.17 | −1.83 |
| | 0.01 | 1.58 | 1.82 | 2.07 | 2.56 | −6.00 | −4.00 | −2.66 | −2.11 | −1.82 | −1.67 | −1.58 |
| | 0.02 | 1.48 | 1.52 | −1.19 | −3.14 | −2.75 | −2.05 | −1.66 | −1.46 | −1.37 | −1.32 | −1.38 |
| | 0.03 | 1.38 | −0.78 | −2.04 | −1.99 | −1.60 | −1.35 | −1.26 | −1.21 | −1.22 | −1.27 | −1.28 |
| | 0.04 | −0.57 | −1.48 | −1.49 | −1.19 | −1.10 | −1.00 | −1.01 | −1.06 | −1.07 | −1.12 | −1.23 |
| | 0.05 | −1.13 | −1.08 | −0.89 | −0.84 | −0.80 | −0.80 | −0.86 | −0.91 | −0.97 | −1.07 | −1.13 |
| | 0.06 | −0.73 | −0.63 | −0.59 | −0.59 | −0.65 | −0.70 | −0.75 | −0.81 | −0.91 | −0.97 | −1.08 |

Figure 27:
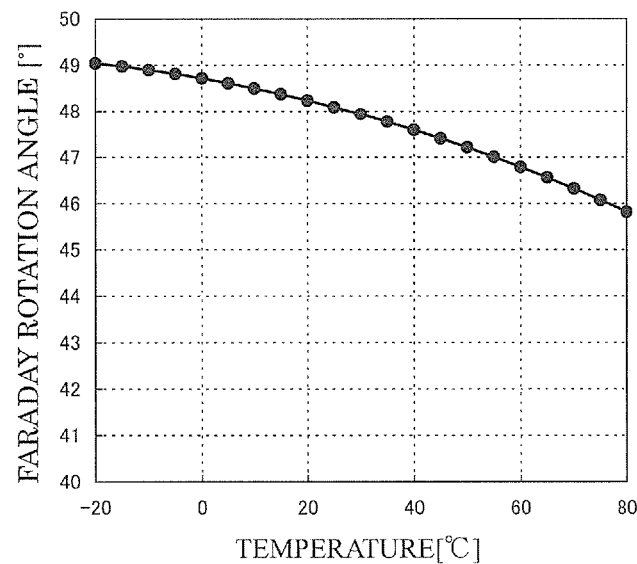
FIG. 27 is a graph illustrating an example of a temperature characteristic of a total Faraday rotation angle of the Faraday elements 27a and 27b in Example 2 of the electric current measuring apparatus according to the present invention.

Tables 2 and 3 show the point-symmetric relation centering on the value when the coefficient a and the coefficient b are 0. From Table 2, the ratio error fluctuation range has the minimum value when the coefficient a and the coefficient b are respectively −0.0001 and −0.02, and when the coefficient a and the coefficient b are respectively 0.0001 and 0.02. As shown in Table 3, the sign of the rotation angle adjustment amount α° at that time is positive in the former case and negative in the latter case. Since general magnetic garnet has the temperature characteristic of the Faraday rotation angle As a result of optimizing the thickness of each of the Faraday elements 27a and 27b, a Faraday element having a temperature dependency expressed by Equation 2 at the time of reciprocation was obtained. The rotation angles of the Faraday element 27a and the Faraday element 27b at the temperature of 23° C. at the time of magnetic saturation are respectively 8.34° and 15.73°, the total Faraday rotation angle of 24.07° is thus obtained, and the factor becomes as α=1.57°. The total Faraday rotation angle at the temperature of 23° C. at the time of magnetic saturation becomes 48.14° when the circularly polarized lights LC1 and LC2 are transmitted in a reciprocating manner. FIG. 27 illustrates the temperature dependency of the total Faraday rotation angle at the time of reciprocation.

$$\theta_F = -2.02 \cdot 10^{-4} \cdot T^2 - 0.0200 \cdot T + 48.71 \quad \text{[Equation 2]}$$

where T is a temperature [° C.]

Figure 28:
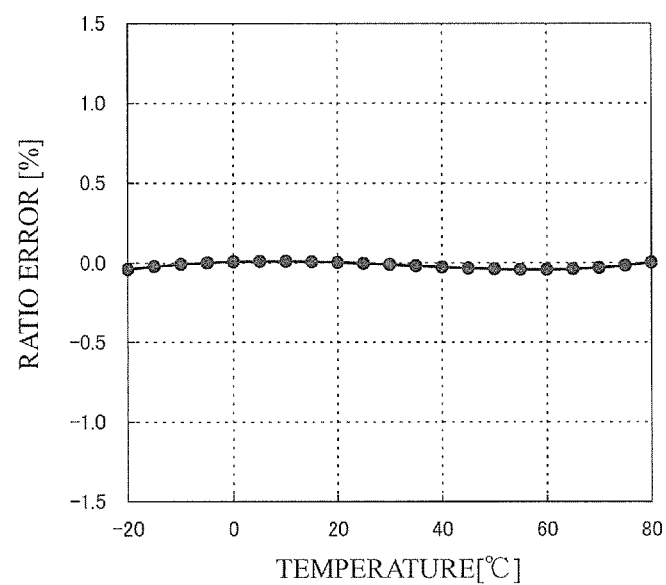
FIG. 28 is a graph illustrating the temperature characteristic of the ratio error in Example 2 of the electric current measuring apparatus of the present invention.

Table 4 and FIG. 28 show the temperature characteristic of the ratio error in the measurement value of the measured electric current I output from the signal processing circuit of the electric current measuring apparatus 28.

TABLE 4

| Temperature T [° C.] | Rotation Angle [deg] | Ratio Error [%] |
| --- | --- | --- |
| −20 | 49.03 | −0.04 |
| −15 | 48.97 | −0.02 |
| −10 | 48.89 | −0.01 |
| −5 | 48.81 | 0.00 |
| 0 | 48.71 | 0.01 |
| 5 | 48.61 | 0.01 |
| 10 | 48.49 | 0.01 |
| 15 | 48.37 | 0.01 |
| 20 | 48.23 | 0.00 |
| 25 | 48.09 | 0.00 |
| 30 | 47.93 | −0.01 |
| 35 | 47.77 | −0.02 |
| 40 | 47.59 | −0.03 |
| 45 | 47.40 | −0.03 |
| 50 | 47.21 | −0.04 |
| 55 | 47.00 | −0.04 |
| 60 | 46.79 | −0.04 |
| 65 | 46.56 | −0.04 |
| 70 | 46.32 | −0.03 |
| 75 | 46.08 | −0.02 |
| 80 | 45.82 | 0.00 |

As is apparent from Table 4 and FIG. 28, in a case in which the two Faraday elements 27a and 27b are provided, and in which α=1.57° is set, the ratio error can fall within −0.04 to 0.01%, setting 23° C. as a standard. That is, the fluctuation range of the ratio error falls within 0.05% through the temperature range between −20° C. or higher and 80° C. or lower.

Example 3

Figure 29:
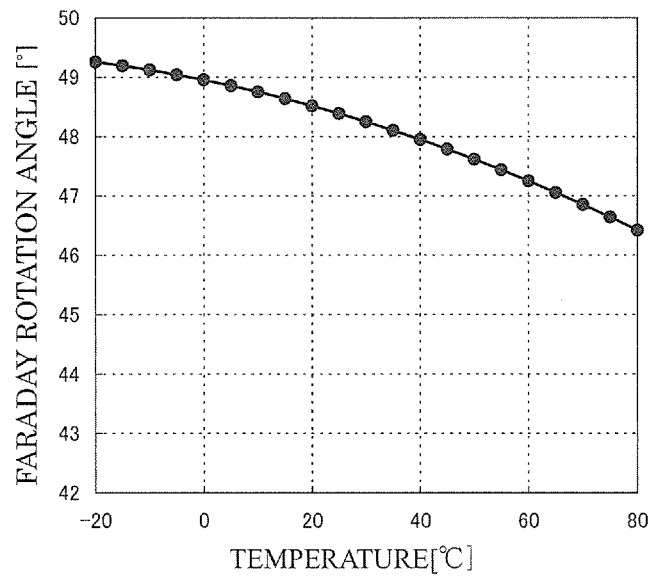
FIG. 29 is a graph illustrating a temperature characteristic of the Faraday rotation angle of the Faraday rotator in Example 3 of the electric current measuring apparatus of the present invention.

Magnetic garnet was developed on the basis of the study result of Table 2 such that the ratio error could be reduced using a single Faraday rotator. As a result, magnetic garnet having temperature dependency expressed by Equation 3 shown below was obtained. The Faraday rotation angle at the temperature of 23° C. was 24.22°, that is, the factor was set as α=1.72°. FIG. 29 illustrates the temperature dependency of the obtained magnetic garnet.

$$\theta_F = -1.64 \cdot 10^{-4} \cdot T^2 - 0.0185 \cdot T + 48.95 \quad \text{[Equation 3]}$$

where T is a temperature [° C.]

The total Faraday rotation angle at the time of magnetic saturation when the circularly polarized lights LC1 and LC2 are transmitted in a reciprocating manner becomes 48.44°. Table 5 and FIG. 30 show the temperature characteristic of the ratio error in the measurement value of the measured electric current I output from the signal processing circuit of the electric current measuring apparatus 1 having the Faraday rotator 3.

TABLE 5

| Temperature T [° C.] | Rotation Angle [deg] | Ratio Error [%] |
| --- | --- | --- |
| −20 | 49.26 | −0.05 |
| −15 | 49.19 | −0.03 |
| −10 | 49.12 | −0.02 |
| −5 | 49.04 | −0.01 |
| 0 | 48.95 | 0.00 |
| 5 | 48.86 | 0.01 |
| 10 | 48.75 | 0.01 |
| 15 | 48.64 | 0.01 |
| 20 | 48.52 | 0.00 |
| 25 | 48.39 | 0.00 |
| 30 | 48.25 | −0.01 |
| 35 | 48.10 | −0.01 |
| 40 | 47.95 | −0.02 |
| 45 | 47.79 | −0.03 |
| 50 | 47.62 | −0.04 |
| 55 | 47.44 | −0.04 |
| 60 | 47.25 | −0.04 |
| 65 | 47.06 | −0.05 |
| 70 | 46.85 | −0.04 |
| 75 | 46.64 | −0.04 |
| 80 | 46.42 | −0.03 |

Figure 30:
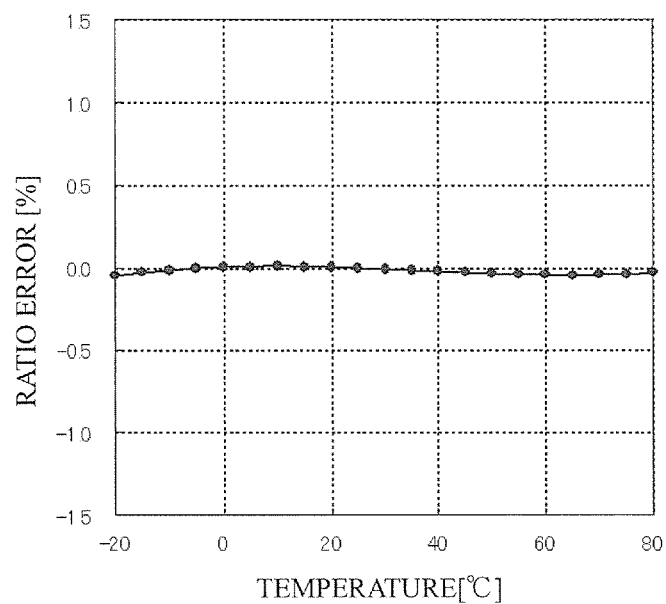
FIG. 30 is a graph illustrating the temperature characteristic of the ratio error in Example 3 of the electric current measuring apparatus of to the present invention.
Figure 31:
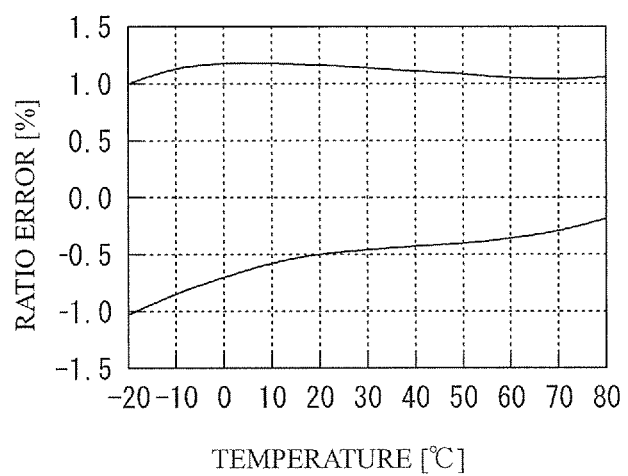
FIG. 31 is a graph illustrating a temperature characteristic of a ratio error showing a fluctuation range of the ratio error of an electric current measuring apparatus disclosed in Patent document 2 mentioned above.

As is apparent from Table 5 and FIG. 30, the ratio error range is −0.05 to 0.01%, and the fluctuation range of the ratio error falls within 0.06% through the temperature range between −20° C. or higher and 80° C. or lower. It was possible to realize the same performance as the single Faraday rotator compared to Example 2.

EXPLANATION OF REFERENCE NUMERALS

1, 28 Electric current measuring apparatus
2 Optical fiber for a sensor
2a One end of optical fiber for a sensor
3 Faraday rotator
3a Permanent magnet
4 First quarter-wave plate
X41 Crystal axis on optical surface of first quarter-wave plate
5 Second quarter-wave plate
X51 Crystal axis on optical surface of second quarter-wave plate
6 Polarization splitter
X61 Crystal axis on optical surface of polarization splitter
7 Light source
8 Signal processing circuit
9 Optical system
10 Circulator
11 First optical fiber
11a End surface on one end side of first optical fiber
12 Second optical fiber
12a End surface on one end side of second optical fiber
13a, 13b Photoelectric conversion element
14 Ferrule
15, 16 Lens
17 Polarization maintaining fiber
17a Core
17b Stress applying portion
17c Cladding
18 Electric conductor
19 Mirror
20a, 20b Birefringent element
X20a, X20b crystal axis on optical surface of each birefringent element
21a, 21b Amplifier
22a, 22b Band-pass filter 23a, 23b Low-pass filter
24a, 24b Divider
25 Polarity inverter
26 Operator
27a, 27b Faraday element
L1 Linearly polarized light emitted from light source
LF, LF' Linearly polarized light in direction of F axis of polarization maintaining fiber
LS, LS' Linearly polarized light in direction of S axis of polarization maintaining fiber
LC1, LC2 Circularly polarized light
LO Ordinary light
LE Extraordinary light
I Measured electric current

The invention claimed is:

1. An electric current measuring apparatus at least comprising:
   a light incident and emitting unit,
   a optical fiber for a sensor,
   a Faraday rotator,
   a first quarter-wave plate and a second quarter-wave plate,
   a polarization splitter,
   a light source, and
   a signal processing circuit including a photoelectric conversion element; and
   the light incident and emitting unit is constituted by two waveguides arrayed; the light incident and emitting unit, the polarization splitter, the first quarter-wave plate, the second quarter-wave plate, the Faraday rotator, and the optical fiber for a sensor are arranged in order;
   the optical fiber for a sensor is birefringent and, is provided around a periphery of an electric conductor through which measured electric current flows, and includes a first end into which two circularly polarized lights having different rotation directions for being incident and a second end for reflecting the incident circularly polarized lights; the second quarter-wave plate is provided on the first end side of the optical fiber for a sensor;
   the Faraday rotator is arranged between the first end side of the optical fiber for a sensor and the second quarter-wave plate;
   a reciprocating optical path is set to reciprocate the light through the polarization splitter, the first quarter-wave plate, the second quarter-wave plate, the Faraday rotator, and the optical fiber for a sensor by reflection of the light emitted from the light source;
   two linearly polarized lights are propagated in the reciprocating optical path between the first quarter-wave plate and the second quarter-wave plate, and a phase difference between the two linearly polarized lights in the reciprocating optical path between the first quarter-wave plate and the second quarter-wave plate is compensated;
   a Faraday rotation angle of the Faraday rotator at time of magnetic saturation is set to $22.5°+\alpha°$ at a temperature of 23° C., such that the fluctuation range of a ratio error in a measurement value of the measured electric current output from the signal processing circuit is set within a range of ±0.5%; and
   directions of crystal axes on respective optical surfaces of the first quarter-wave plate and the second quarter-wave plate are set to be perpendicular to each other or in an equal direction.

2. The electric current measuring apparatus according to claim 1, wherein a direction of a crystal axis on an optical surface of the polarization splitter and the direction of the crystal axis on the optical surface of the first quarter-wave plate are set to be perpendicular to each other or in an equal direction.

3. The electric current measuring apparatus according to claim 1, wherein the direction of the crystal axis on the optical surface of the polarization splitter, the direction of the crystal axis on the optical surface of the first quarter-wave plate, and the direction of the crystal axis on the optical surface of the second quarter-wave plate are set to be in an equal direction.

4. The electric current measuring apparatus according to claim 1, wherein a temperature range in which the fluctuation range is set within a range of ±0.5% is 100 degrees in the Celsius scale.

5. The electric current measuring apparatus according to claim 4, wherein the temperature range of 100 degrees in the Celsius scale is between −20° C. or higher and 80° C. or lower.

6. The electric current measuring apparatus according to claim 1, wherein the Faraday rotator has a temperature characteristic of a Faraday rotation angle such that the Faraday rotation angle at time of magnetic saturation changes in a quadratic curve shape in accordance with a change in temperature.

7. The electric current measuring apparatus according to claim 1, wherein the Faraday rotator has two or more Faraday elements.

8. The electric current measuring apparatus according to claim 7, wherein Faraday rotation angles of the two or more Faraday elements are different from each other.

9. The electric current measuring apparatus according to claim 6, wherein the fluctuation range of the ratio error in the measurement value of the measured electric current output from the signal processing circuit is set within a range of ±0.2%.

10. The electric current measuring apparatus according to claim 9, wherein a temperature range in which the fluctuation range is set within a range of ±0.2% is 100 degrees in the Celsius scale.

11. The electric current measuring apparatus according to claim 10, wherein the temperature range of 100 degrees in the Celsius scale is between −20° C. or higher and 80° C. or lower.

12. The electric current measuring apparatus according to claim 1, wherein the optical fiber for a sensor is a lead-glass fiber.

* * * * *